United States Patent
Sorada et al.

(10) Patent No.: US 8,618,526 B2
(45) Date of Patent: Dec. 31, 2013

(54) NONVOLATILE MEMORY DEVICE AND MANUFACTURING METHOD THEREOF

(75) Inventors: Haruyuki Sorada, Okayama (JP);
Takeki Ninomiya, Osaka (JP); Takumi Mikawa, Shiga (JP); Yukio Hayakawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/501,228

(22) PCT Filed: Aug. 11, 2011

(86) PCT No.: PCT/JP2011/004553
§ 371 (c)(1),
(2), (4) Date: Apr. 10, 2012

(87) PCT Pub. No.: WO2012/023269
PCT Pub. Date: Feb. 23, 2012

(65) Prior Publication Data
US 2012/0199805 A1    Aug. 9, 2012

(30) Foreign Application Priority Data
Aug. 17, 2010    (JP) .................................. 2010-182098

(51) Int. Cl.
*H01L 47/00*    (2006.01)

(52) U.S. Cl.
USPC .............. 257/4; 257/536; 257/537; 438/385; 438/104

(58) Field of Classification Search
USPC .......................................... 257/536, 537, 4
See application file for complete search history.

(56) References Cited

U.S. PATENT DOCUMENTS 8,148,711 B2 *    4/2012    Fujii et al. .................... 257/5
8,203,134 B2 *    6/2012    Liu ................................ 257/4
(Continued)

FOREIGN PATENT DOCUMENTS

| JP | 2008-294103 | 12/2008 |
| JP | 2010-16075 | 1/2010 |

(Continued)

OTHER PUBLICATIONS

Baek, I.G., et al., "Highly Scalable Non-volatile Resistive Memory using Simple Binary Oxide Driven by Asymmetric Unipolar Voltage Pulses", Electron Devices Meeting, IEDM Technical Digest, Dec. 13-15, 2004, pp. 587-590, IEEE International.

(Continued)

*Primary Examiner* — Eugene Lee
(74) *Attorney, Agent, or Firm* — McDermott Will & Emery LLP

(57) ABSTRACT

Provided are a nonvolatile memory device which can suppress non-uniformity in initial breakdown voltages among nonvolatile memory elements and prevent reduction of yield, and a manufacturing method thereof. The nonvolatile memory device includes a nonvolatile memory element (108) having a stacked-layer structure in which a resistance variable layer (106) is parallel to a main surface of a substrate (117) and is planarized, and a plug (103) electrically connected to either a first electrode (105) or a second electrode (107), and an area of an end surface of a plug (103) at which the plug (103) and the nonvolatile memory element (108) are connected together, the end surface being parallel to the main surface of the substrate (117), is greater than a cross-sectional area of a cross-section of a first transition metal oxide layer (115) which is an electrically-conductive region, the cross-section being parallel to the main surface of the substrate (117).

13 Claims, 15 Drawing Sheets

(56) References Cited

U.S. PATENT DOCUMENTS

| | | |
|---|---|---|
| 8,263,958 B2 * | 9/2012 | Campbell et al. .............. 257/2 |
| 2009/0014710 A1 | 1/2009 | Kawashima et al. |
| 2009/0096568 A1 | 4/2009 | Hosoi et al. |
| 2009/0101883 A1 * | 4/2009 | Lai et al. ........................ 257/3 |
| 2009/0101884 A1 * | 4/2009 | Tu .................................. 257/3 |
| 2009/0200640 A1 | 8/2009 | Hosoi et al. |
| 2009/0283736 A1 | 11/2009 | Kanzawa et al. |
| 2010/0127233 A1 | 5/2010 | Goux et al. |
| 2010/0177555 A1 | 7/2010 | Shimakawa et al. |
| 2010/0200852 A1 | 8/2010 | Kawashima et al. |
| 2010/0295012 A1 | 11/2010 | Mikawa et al. |
| 2010/0314602 A1 | 12/2010 | Takano et al. |
| 2011/0001110 A1 | 1/2011 | Takahashi |
| 2011/0006278 A1 | 1/2011 | Takahashi |
| 2011/0057246 A1 * | 3/2011 | Araki et al. .................. 257/319 |
| 2011/0294259 A1 | 12/2011 | Kanzawa et al. |
| 2012/0063201 A1 | 3/2012 | Hayakawa et al. |
| 2013/0056701 A1 | 3/2013 | Mikawa et al. |

FOREIGN PATENT DOCUMENTS

| | | |
|---|---|---|
| JP | 2010-503195 A | 1/2010 |
| JP | 2010-177654 A | 8/2010 |
| WO | 2008/078197 A2 | 7/2008 |
| WO | 2010/058569 A1 | 5/2010 |

OTHER PUBLICATIONS

Bibliographic information and Abstract for Baek, I.G., et al., "Highly Scalable Non-volatile Resistive Memory using Simple Binary Oxide Driven by Asymmetric Unipolar Voltage Pulses", Electron Devices Meeting, IEDM Technical Digest, Dec. 13-15, 2004, 4 pages, IEEE International.

International Search Report, issued in International Patent Application No. PCT/JP2011/004553, dated Nov. 15, 2011.

Japanese Office Action issued in Japanese Application No. 2012-111674 dated Oct. 15, 2013.

* cited by examiner

NONVOLATILE MEMORY DEVICE AND MANUFACTURING METHOD THEREOF

RELATED APPLICATIONS

This application is the U.S. National Phase under 35 U.S.C. §371 of International Application No. PCT/JP2011/004553, filed on Aug. 11, 2011, which in turn claims the benefit of Japanese Application No. 2010-182098, filed on Aug. 17, 2010, the disclosures of which Applications are incorporated by reference herein.

TECHNICAL FIELD

The present invention relates to a rewritable nonvolatile memory device using a resistance variable layer and a manufacturing method thereof.

BACKGROUND ART

A flash memory which is a representative of a nonvolatile memory is incorporated into USB memories, memory cards, cellular phones, silicon audio, and others and is mainly used as a storage for storing motion picture data, music data, or digital data. In recent years, development has been made to provide higher-definition motion pictures or images and data capacities have been increasing. Under the circumstances, in view of alternatives of hard discs of note-type PCs, there has been an increasing demand for a larger capacity of the flash memory.

However, development of a larger capacity of the flash memory is approaching a limit, in terms of miniaturization and reliability. In place of the flash memory, new nonvolatile memories which can implement a larger capacity have been developed vigorously. Among the nonvolatile memories, there is a resistance variable memory (ReRAM: Resistive Random Access Memory). The resistance variable memory uses a resistance variable layer which changes its resistance values as a material of a memory element. The resistance variable memory change its resistance value from a higher-resistance state to a lower-resistance state or from the lower-resistance state to the higher-resistance state, by application of electric pulses (e.g., voltage pulses), thereby storing data. In this case, it is necessary to clearly distinguish two values corresponding to the higher-resistance state and the lower-resistance state, stably change the resistance state between the lower-resistance state and the higher-resistance state at a higher speed, and to retain these two values in a non-volatile manner. As an exemplary nonvolatile memory element, there has been proposed a nonvolatile memory element using a resistance variable layer including transition metal oxides which are different in oxygen content and are stacked together. Oxidization or reduction are caused to take place selectively in a region of an interface between a transition metal oxide layer with a higher oxygen content and an electrode in contact with this transition metal oxide layer and thereby a resistance changing phenomenon is stabilized (e.g., Patent Literature 1).

FIG. 16 is a cross-sectional view showing a resistance variable nonvolatile memory device 50 including a nonvolatile memory element 55 disclosed in Patent Literature 1. In the nonvolatile memory device 50 shown in FIG. 16, a first wire 61 is formed on a substrate 60, and a first interlayer insulating layer 62 is formed to cover the first wire 61. A first plug 64 penetrates the first interlayer insulating layer 62 and is connected to the first wire 61. Furthermore, a nonvolatile memory element 55 including a lower electrode 65, a resistance variable layer 66 and an upper electrode 67 is formed on the first interlayer insulating layer 62 to cover the first plug (conductive plug) 64. A second interlayer insulating layer 68 is formed to cover the nonvolatile memory element 55. A second plug 70 penetrates the second interlayer insulating layer 68. The second plug 70 connects an upper electrode 67 to a second wire 71. The resistance variable layer 66 has a stacked-layer structure including a first resistance variable layer 66$x$ and a second resistance variable layer 66$y$ which are stacked together. The first resistance variable layer 66$x$ and the second resistance variable layer 66$y$ of the resistance variable layer 66 comprise transition metal oxides of the same kind, respectively, and the transition metal oxide constituting the first resistance variable layer 66$x$ has a higher oxygen content than the transition metal oxide constituting the second resistance variable layer 66$y$.

In such a structure, when a voltage is applied to the nonvolatile memory element 55, a most portion of the voltage is applied to the first resistance variable layer 66$x$ having a higher oxygen content and exhibiting a higher resistance value. In a region of the first resistance variable layer 66$x$, a plenty of oxygen used for reaction is present. Therefore, redox reaction takes place selectively in a region in the vicinity of an interface between the first resistance variable layer 66$x$ and the upper electrode 67, and thus, stable resistance change is implemented.

Non-patent Literature 1 discloses a nonvolatile memory including a 1T1R (unit cell is composed of one transistor and one resistive element) using transition metal oxide as a resistance variable layer. Non-patent Literature 1 recites that a transition metal oxide layer is an insulator in a normal state, and breakdown (initial breakdown) occurs initially in the resistance variable layer to change the resistance value by application of electric pulses, thereby forming a conductive path which enables switching between the higher-resistance state and the lower-resistance state. The "initial breakdown" is defined as a process for changing the resistance variable layer after manufacture to transition reversibly between the higher-resistance state and the lower-resistance state, in response to an applied voltage or a polarity of the applied voltage. To be specific, a voltage (initial breakdown voltage) greater in magnitude than a write voltage is applied to the resistance variable layer after manufacture and having a very high resistance value, or a nonvolatile memory element including the resistance variable layer. The initial breakdown enables the resistance variable layer to transition reversibly between the higher-resistance state and the lower-resistance state, and to decrease its resistance value.

CITATION LISTS

Patent Literature

Patent literature 1: International Publication No. 2008/149484

Non-Patent Literature

Non-patent Literature 1: "Highly Scalable Non-volatile Resistive Memory using Simple Binary Oxide Driven by Asymmetric Unipolar Voltage Pulses" I. G. Beak et al., IEDM2004, p. 587

SUMMARY OF THE INVENTION

Technical Problem

It is considered that the conductive path formed by the initial breakdown has a filament-like shape. A cross-sectional area of a horizontal cross-section of the conductive path is much smaller than a cross-sectional area of a horizontal cross-section of a plug connected to an electrode of the nonvolatile memory element. In addition, it is impossible to identify which location of the resistance variable layer the conductive path is formed. In this case, non-uniformity occurs in initial breakdown voltages for forming the conductive path, among a plurality of nonvolatile memory elements. If non-uniformity occurs in the initial breakdown voltages, there is a possibility that non-uniformity occurs in resistance changing characteristics, and as a result, yield or reliability of a nonvolatile memory device including a plurality of nonvolatile memory elements decreases. In particular, iridium (Ir) or alloy of Ir and another precious metal is used as a material of an upper electrode, the initial breakdown voltage changes sensitively due to non-uniformity in dimensions among the nonvolatile memory elements. The nonvolatile memory element using such an electrode material has a problem that non-uniformity in the initial breakdown voltages among the nonvolatile memory elements increases.

The present invention is directed to solving the above mentioned problem, and an object of the present invention is to provide a nonvolatile memory device which is capable of suppressing non-uniformity in initial breakdown voltages among nonvolatile memory elements and of preventing reduction of yield, and a manufacturing method thereof.

Solution to Problem

According to an aspect of the present invention, a nonvolatile memory device comprises a nonvolatile memory element provided on a substrate, and including a first electrode, a second electrode, and a resistance variable layer provided between the first electrode and the second electrode, resistance values of the resistance variable layer changing reversibly in response to electric signals applied between the first electrode and the second electrode, the nonvolatile memory element having a stacked-layer structure in which the first electrode, the second electrode and the resistance variable layer are stacked together such that the first electrode, the second electrode and the resistance variable layer are parallel to a main surface of the substrate and are planarized; and a plug electrically connected to either the first electrode or the second electrode of the nonvolatile memory element; wherein the resistance variable layer includes an oxygen-deficient first transition metal oxide layer and a second transition metal oxide layer having a higher oxygen content than the first transition metal oxide layer; the first transition metal oxide layer is connected to one of the first electrode and the second electrode, and the second transition metal oxide layer is connected to the other of the first electrode and the second electrode; and an area of an end surface of the plug at which the plug and the nonvolatile memory element are connected together, the end surface being parallel to the main surface of the substrate, is greater than a cross-sectional area of a cross-section of the first transition metal oxide layer which is an electrically-conductive region, the cross-section being parallel to the main surface of the substrate.

In accordance with the above configuration, the area of the surface of the plug which is parallel to the main surface of the substrate, is greater than the cross-sectional area of the cross-section of the first transition metal oxide layer which is the electrically-conductive region of the resistance variable layer, the cross-section being parallel to the main surface of the substrate. Therefore, the entire nonvolatile memory element can be located inward relative to the plug even when the plug and the nonvolatile memory element having the stacked-layer structure are misaligned with each other, or non-uniformity occurs in dimensions the stacked-layer structures. Because of this, the density of the current flowing through the nonvolatile memory element during the initial breakdown is determined by the cross-sectional area of the resistance variable layer, and is not affected by the misalignment. As a result, it is possible to lessen non-uniformity occurring in densities of the currents flowing through the nonvolatile memory element, and lessen electric failure. This can prevent reduction of yield, and improve reliability.

The second transition metal oxide layer may be an insulator.

The nonvolatile memory device may further comprise: a plurality of first wires formed on the substrate such that the plurality of first wires are arranged in parallel with each other within a plane parallel to the main surface of the substrate; a plurality of second wires formed within a plane different from the plane of the plurality of first wires such that the plurality of second wires are arranged in parallel with each other and three-dimensionally cross the plurality of first wires, respectively; and nonvolatile memory elements provided to correspond to three-dimensional cross-points of the plurality of first wires and the plurality of second wires, respectively; wherein each of the nonvolatile memory elements may be configured such that the first electrode is electrically connected to a corresponding one of the first wires, the second electrode is electrically connected to a corresponding one of the second wires, resistance values of the resistance variable layer changing reversibly in response to electric signals applied between the first electrode and the second electrode, via the corresponding one of the first wires and the corresponding one of the second wires; and one of the first electrode and the second electrode may be electrically connected to one of the corresponding one of the first wires and the corresponding one of the second wires, via the plug, and the other of the first electrode and the second electrode is directly electrically connected to the other of the corresponding one of the first wires and the corresponding one of the second wires.

The first electrode or the second electrode connected with the second transition metal oxide layer of the resistance variable layer may comprise iridium or alloy of iridium and another precious metal.

The resistance variable layer may further include a third transition metal oxide layer provided to cover a side surface of the first transition metal oxide layer and a side surface of the second transition metal oxide layer, the third transition metal oxide layer having a higher oxygen content than the first transition metal oxide layer; the third transition metal oxide layer is sandwiched between the first electrode and the second electrode; and the area of the end surface of the plug at which the plug and the nonvolatile memory element are connected together, the end surface being parallel to the main surface of the substrate, is greater than a cross-sectional area of a cross-section of the first transition metal oxide layer which is an electrically-conductive region, the cross-section being parallel to the main surface of the substrate, and is smaller than an area of a surface of the first electrode and an area of a surface of the second electrode, the surface of the first electrode and the surface of the second electrode being parallel to the main surface of the substrate.

The area of the end surface of the plug at which the plug and the nonvolatile memory element are connected together, may be greater than a cross-sectional area of a cross-section of the nonvolatile memory element, the cross-section being parallel to the main surface of the substrate.

According to another aspect of the present invention, a nonvolatile memory device comprises a nonvolatile memory element provided on a substrate, and including a first electrode, a second electrode, and a resistance variable layer provided between the first electrode and the second electrode, resistance values of the resistance variable layer changing reversibly in response to electric signals applied between the first electrode and the second electrode, the nonvolatile memory element having a stacked-layer structure in which the first electrode, the second electrode and the resistance variable layer are stacked together such that the first electrode, the second electrode and the resistance variable layer are parallel to a main surface of the substrate and are planarized; a plug electrically connected to either the first electrode or the second electrode of the nonvolatile memory element; a first wire formed within a plane parallel to the main surface of the substrate; and a second wire formed within a plane different from the plane of the first wire; one of the first wire and the second wire is electrically connected to one of the first electrode and the second electrode of the nonvolatile memory element via the plug, and the other of the first wire and the second wire is directly electrically connected to the other of the first electrode and the second electrode of the nonvolatile memory element; wherein the resistance variable layer may include an oxygen-deficient first transition metal oxide layer and a second transition metal oxide layer having a higher oxygen content than the first transition metal oxide layer; the first transition metal oxide layer may be connected to one of the first electrode and the second electrode, and the second transition metal oxide layer is connected to the other of the first electrode and the second electrode; and an area of an end surface of the plug at which the plug and the nonvolatile memory element are connected together, the end surface being parallel to the main surface of the substrate, is greater than a cross-sectional area of a cross-section of the first transition metal oxide layer which is an electrically-conductive region, the cross-section being parallel to the main surface of the substrate.

In accordance with the above configuration, the area of the surface of the plug which is parallel to the main surface of the substrate, is greater than the cross-sectional area of the cross-section of the first transition metal oxide layer which is the electrically-conductive region of the resistance variable layer, the cross-section being parallel to the main surface of the substrate. Therefore, the entire nonvolatile memory element can be located inward relative to the plug even when misalignment between the plug and the nonvolatile memory element having the stacked-layer structure, occurs, or non-uniformity occurs in dimensions of the stacked-layer structures. Because of this, the density of the current flowing through the nonvolatile memory element during the initial breakdown is determined by the cross-sectional area of the resistance variable layer, and is not affected by the misalignment. Since the first wire or the second wire which is connected to the first electrode or the second electrode which is at an opposite side of the plug is directly electrically connected to the nonvolatile memory element, reduction of a density of a current flowing through the nonvolatile memory element during initial breakdown can be suppressed as compared to a configuration in which plugs are provided on both sides of the nonvolatile memory element, respectively. If a plug (upper-layer plug) is provided at the other side of the nonvolatile memory element, misalignment of the upper plug with respect to the nonvolatile memory element is likely to occur. This makes it difficult to keep a current flowing through the nonvolatile memory element during initial breakdown at a high density. Also, the plug itself may become a parasitic resistance component, and may possibly impede stability of the current density. Therefore, by configuring the constituents such that the area of the surface of the plug at one side of the nonvolatile memory element, which is parallel to the main surface of the substrate, is made greater than the cross-sectional area of the surface of the first transition metal oxide layer which is parallel to the main surface of the substrate, and the electrode of the nonvolatile memory element at the other side of the nonvolatile memory element is directly connected to the first wire or the second wire, non-uniformity in densities of a current flowing through the nonvolatile memory element is lessened, and hence electric failure is lessened. This can prevent reduction of yield, and improve reliability. Furthermore, the number of manufacturing process steps can be reduced and cost can be reduced, because of absence of the upper plug.

Each of the first wire and the second wire may comprise copper as a major component.

According to another aspect of the present invention, a method of manufacturing a nonvolatile memory device, comprises: a step A of forming at least a wire and a plug connected to the wire, on a substrate; and a step B of forming above the plug, a stacked-layer structure including a first electrode, a second electrode located above the first electrode, and a resistance variable layer provided between the first electrode and the second electrode, resistance values of the resistance variable layer changing reversibly in response to electric signals applied between the first electrode and the second electrode, the stacked-layer structure having a structure in which the first electrode, the second electrode and the resistance variable layer are stacked together such that the first electrode, the second electrode and the resistance variable layer are parallel to a main surface of the substrate and are planarized; wherein the step B includes, to form the resistance variable layer, a step b1 of forming an oxygen-deficient first transition metal oxide layer connected to one of the first electrode and the second electrode; a step b2 of forming a second transition metal oxide layer connected to the other of the first electrode and the second electrode and having a higher oxygen content than the first transition metal oxide layer; and a step b3 of forming the plug and/or the stacked-layer structure such that an area of an end surface of the plug at which the plug and the stacked-layer structure are connected together, is greater than a cross-sectional area of a cross-section of the first transition metal oxide layer which is an electrically-conductive region, the cross-section being parallel to the main surface of the substrate.

In accordance with the above method, the area of the surface of the plug which is parallel to the main surface of the substrate, is greater than the cross-sectional area of the cross-section of the first transition metal oxide layer which is the electrically-conductive region of the resistance variable layer, the cross-section being parallel to the main surface of the substrate. Therefore, the entire nonvolatile memory element can be located inward relative to the plug even when the plug and the nonvolatile memory element having the stacked-layer structure are misaligned with each other, or non-uniformity occurs in dimensions of the stacked-layer structures. Because of this, the density of the current flowing through the nonvolatile memory element during the initial breakdown is determined by the cross-sectional area of the resistance variable layer, and is not affected by the misalignment. As a result, it is possible to lessen non-uniformity occurring in densities of the currents flowing through the nonvolatile memory element and lessen electric failure. This can prevent reduction of yield, and improve reliability.

The step A may include a step a1 of forming a plurality of first wires in parallel with each other, on the substrate, and a step a2 of forming a plurality of plugs on the plurality of first wires, respectively; the method may further comprise a step C of forming a plurality of second wires within a plane parallel to the main surface of the substrate above the stacked-layer structures and the plugs such that the plurality of second wires are arranged in parallel with each other and three-dimensionally cross the plurality of first wires, respectively; wherein one of the first electrode and the second electrode is electrically connected to corresponding one of the first wires via the plug, and the other of the first electrode and the second electrode is directly electrically connected to corresponding one of the second wires.

The step B may include stacking a first electrode layer, above the plug; stacking a transition metal oxide layer including the first transition metal oxide layer and the second transition metal oxide layer, on the first electrode layer; stacking a second electrode layer on the transition metal oxide layer to form a stacked-layer constituent; and removing a portion of the stacked-layer constituent to form the stacked-layer structure on the plug.

The step B may further include oxidizing a side surface of the resistance variable layer to form a third transition metal oxide layer such that the third transition metal oxide layer covers a side surface of the first transition metal oxide layer and has a higher oxygen content than the first transition metal oxide layer, to reduce an area of the first transition metal oxide layer which is parallel to the main surface of the substrate so that a cross-sectional area of a cross-section of the first transition metal oxide layer which is an electrically-conductive region, the cross-section being parallel to the main surface of the substrate, is smaller than an area of an end surface of the plug at which the plug and the stacked-layer structure are connected together.

According to another aspect of the present invention, a method of manufacturing a nonvolatile memory device, comprises a step A of forming at least a first wire and a plug connected to the first wire, on a substrate; a step B of forming above the plug, a stacked-layer structure including a first electrode, a second electrode located above the first electrode, and a resistance variable layer provided between the first electrode and the second electrode, resistance values of the resistance variable layer changing reversibly in response to electric signals applied between the first electrode and the second electrode, the stacked-layer structure having a structure in which the first electrode, the second electrode and the resistance variable layer are stacked together such that the first electrode, the second electrode and the resistance variable layer are parallel to a main surface of the substrate and are planarized; and a step C of forming a second wire within a plane parallel to the main surface of the substrate above the stacked-layer structure and the plug; and the step B may include, to form the resistance variable layer, a step b1 of forming an oxygen-deficient first transition metal oxide layer connected to one of the first electrode and the second electrode; a step b2 of forming a second transition metal oxide layer connected to the other of the first electrode and the second electrode and having a higher oxygen content than the first transition metal oxide layer; and a step b3 of forming the plug and/or the stacked-layer structure such that an area of an end surface of the plug at which the plug and the stacked-layer structure are connected together, is greater than a cross-sectional area of a cross-section of the first transition metal oxide layer which is an electrically-conductive region, the cross-section being parallel to the main surface of the substrate; and the step C may include, to form the second wire, a step c1 of forming an insulating layer such that the insulating layer covers stacked-layer structure; a step c2 of removing a portion of the insulating layer such that the stacked-layer structure is exposed, to form a wire trench on the stacked-layer structure; and a step c3 of forming the second wire into the wire trench.

In accordance with the above method, the area of the surface of the plug which is parallel to the main surface of the substrate, is greater than the cross-sectional area of the cross-section of the first transition metal oxide layer which is the electrically-conductive region of the resistance variable layer, the cross-section being parallel to the main surface of the substrate. Therefore, the entire nonvolatile memory element can be located inward relative to the plug even when the plug and the nonvolatile memory element having the stacked-layer structure are misaligned with each other, or non-uniformity occurs in dimensions of the stacked-layer structures. Because of this, the density of the current flowing through the nonvolatile memory element during the initial breakdown is determined by the cross-sectional area of the resistance variable layer, and is not affected by the misalignment. Since the first wire or the second wire which is connected to the first electrode or the second electrode which is at an opposite side of the plug is directly electrically connected to the nonvolatile memory element, reduction of a density of a current flowing through the nonvolatile memory element during initial breakdown can be suppressed as compared to a configuration in which plugs are provided on both sides of the nonvolatile memory element, respectively. If a plug (upper-layer plug) is provided at the other side of the nonvolatile memory element, misalignment of the upper plug with respect to the nonvolatile memory element is likely to occur. This makes it difficult to keep a current flowing through the nonvolatile memory element during initial breakdown at a high density. Also, the plug itself may become a parasitic resistance component, and may possibly impede stability of the current density. Therefore, by configuring the constituents such that the area of the surface of the plug at one side of the nonvolatile memory element, which is parallel to the main surface of the substrate, is made greater than the cross-sectional area of the surface of the first transition metal oxide layer which is parallel to the main surface of the substrate, and the electrode of the nonvolatile memory element at the other side of the nonvolatile memory element is directly connected to the first wire or the second wire, non-uniformity in densities of a current flowing through the nonvolatile memory element is lessened, and hence electric failure is lessened. This can prevent reduction of yield, and improve reliability. Furthermore, the number of manufacturing process steps can be reduced and cost can be reduced, because of absence of the upper plug.

The above and further objects and features of the invention will more fully be apparent from the following detailed description with reference to the accompanying drawings.

Advantageous Effects of the Invention

The present invention has been configured as described above, and has advantages that non-uniformity in initial breakdown voltages among nonvolatile memory elements can be suppressed and reduction of yield can be prevented.

DESCRIPTION OF THE EMBODIMENTS

Hereinafter, embodiments of the present invention will be described with reference to the drawings.

Embodiment 1

Figure 1:
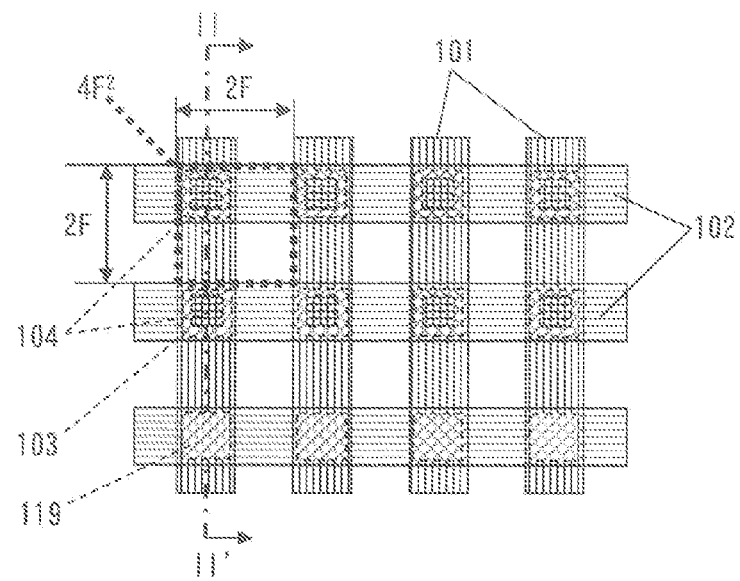
FIG. 1 is a plan view showing a configuration of a nonvolatile memory device according to Embodiment 1 of the present invention.
Figure 2:
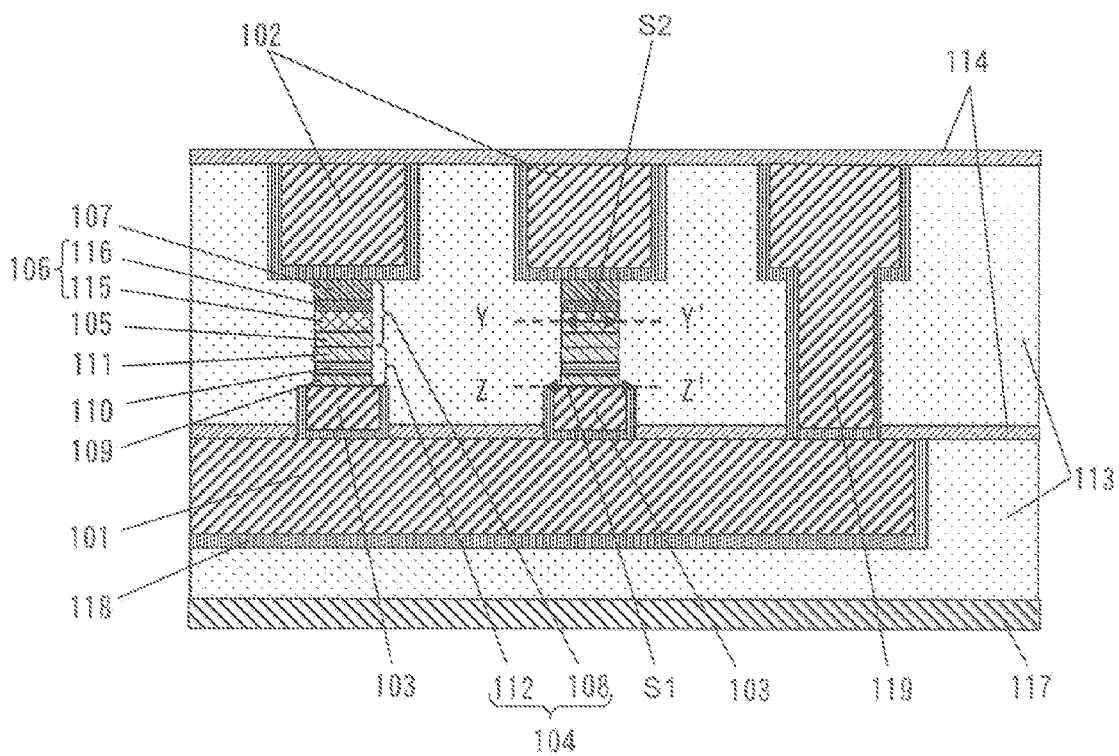
FIG. 2 is a cross-sectional view of the nonvolatile memory device taken along line II-II' in FIG. 1.

FIG. 1 is a plan view showing a configuration of a nonvolatile memory device according to Embodiment 1 of the present invention. FIG. 2 is a cross-sectional view of the nonvolatile memory device taken along line II-II' in FIG. 1.

As shown in FIGS. 1 and 2, the nonvolatile memory device of the present embodiment includes memory cells 104 formed at cross-points where a plurality of first wires 101 comprising, for example, copper (Cu) as a major component, three-dimensionally cross a plurality of second wires 102 comprising, for example, copper as a major component, respectively such that each of the memory cells 104 includes a nonvolatile memory element 108 and a current controlling element 112 which are connected in series, and is configured in such a manner that the memory cells are laid out in array, thereby constituting a memory cell array. The plurality of first wires 101 extend in parallel on a semiconductor substrate 117. The plurality of second wires 102 extend in parallel with each other within a plane parallel (hereinafter referred to as horizontal) to a main surface of the semiconductor substrate 117 above the plurality of first wires 101 and three-dimensionally cross the plurality of first wires 101, respectively.

In the present embodiment, the first wire 101 and the second wire 102 have a thickness of, for example, 300 nm to 400 nm. Each of the first wire 101 comprising copper and the second wire 102 comprising copper is filled into a trench formed in an interlayer insulating layer 113 comprising, for example, plasma $SiO_2$, FSG; or SiON which is lower in dielectric constant than a normal silicon thermal oxide layer, via a barrier layer 118 (10 to 40 nm in thickness, 20 nm in the present embodiment) comprising, for example, tantalum (Ta) or tantalum nitride (TaN). Further, an SiN layer (about 50 nm-thick) deposited by, for example, plasma CVD, is formed as a liner layer 114, on each of the first wire 101 and the second wire 102, and the interlayer insulating layer 113 is further formed thereon. Some of plugs 119 are each connected directly to the second wire 102 and to a peripheral circuit (not shown) without via the nonvolatile memory elements 108.

Each of the nonvolatile memory elements 108 comprises a first electrode 105 electrically connected to the corresponding first wire 101, a second electrode 107 electrically connected to the corresponding second wire 102, and a resistance variable layer 106 which is placed between the first electrode 105 and the second electrode 107 and changes its resistance values reversibly in response to electric signals applied between the first electrode 105 and the second electrode 107 via the corresponding first wire 101 and the corresponding second wire 102, respectively.

The first electrode 105 comprises a material selected from, for example, tantalum (Ta), tantalum nitride (TaN), titanium (Ti), titanium nitride (TiN), etc., and is about 10 to 100 nm in thickness. In the present embodiment, the first electrode 105 comprises tantalum nitride and its thickness is set to 30 nm.

A first region (first transition metal oxide layer) 115 of the resistance variable layer 106 comprises an oxygen-deficient transition metal oxide comprising tantalum, titanium, nickel (Ni), etc., deposited by, for example, reactive sputtering in which a transition metal oxide layer is deposited by sputtering using a transition metal target in atmosphere containing oxygen, and has a thickness of 10 to 100 nm and a resistivity of 0.5 to 20 mΩ·cm. In the present embodiment, the first region 115 of the resistance variable layer comprises the oxygen-deficient tantalum oxide. The thickness of the first region 115 is set to 45 nm and its resistivity is set to 2 mΩ·cm. As used herein, the oxygen-deficient transition metal oxide refers to a transition metal oxide which is less ($0 < x < 2.5$ when the tantalum oxide is expressed as $TaO_x$) in oxygen content than a transition metal oxide ($Ta_2O_5$ in the case of the tantalum oxide) having a stoichiometric composition. The transition metal oxide having a stoichiometric composition exhibits an insulator property, while the oxygen-deficient transition metal oxide exhibits a semiconductive or insulator property according to a content of oxygen. The first region 115 exhibits a semiconductive property and has an electric conductivity. The second region (second transition metal oxide layer) 116 has a thickness of 1 to 10 nm and is substantially formed as an insulator. The second region 116 of the resistance variable layer may be formed by, for example, oxidizing a surface of the first region 111. In the present embodiment, the second region 116 has a thickness of 5 nm. The resistance variable layer 106 is constituted by the first region 115 and the second region 116.

In the present embodiment, the tantalum oxide of the first region 115 of the resistance variable layer 106 satisfies $0 < x < 2.5$, preferably, $0.8 \leq x \leq 1.9$, when the tantalum oxide is expressed as $TaO_x$. The tantalum oxide of the second region 116 of the resistance variable layer 106 satisfies $x < y \leq 2.5$, for example, $Ta_2O_5$, when the tantalum oxide is expressed as $TaO_y$. Tantalum and its oxide are materials generally used in normal semiconductor process steps. Therefore, it may be said that tantalum and its oxide have a very high compatibility with the normal semiconductor process steps. Because of this, tantalum and its oxide can be easily incorporated into the existing semiconductor process steps.

It may be said that a degree of oxygen deficiency of the second region 116 of the resistance variable layer 106 is less than a degree of oxygen deficiency of the first region 115 of the resistance variable layer 106. As used herein, the degree of oxygen deficiency refers to a ratio of deficient oxygen with respect to the amount of oxygen constituting the oxide having a stoichiometric composition, in each transition metal. In general, the oxide having a stoichiometric composition commonly exhibits an insulator property, while the oxygen-deficient transition metal oxide commonly exhibits a semiconductive property. That is, the second region 116 of the resistance variable layer 106 is preferably lower in degree of oxygen deficiency and has a higher resistance than the first region 115. In such a configuration, when a voltage is applied between the first electrode 105 and the second electrode 107, a larger part of the voltage is fed to the second region 116 of the resistance variable layer 106, thereby facilitating a redox reaction in the second region 116 of the resistance variable layer 106.

The second electrode 107 comprises, for example, precious metal such as platinum (Pt), iridium (Ir), palladium (Pd), or ruthenium (Ru), or alloy containing these, and has a thickness of about 10 to 100 nm. In the present embodiment, the second electrode 107 comprises iridium, and its thickness is set to 50 nm.

As descried above, the resistance variable layer 106 includes the first region 115 which is in contact with the first electrode 105 and comprises an oxygen-deficient transition metal oxide, and the second region 116 which is in contact with the second electrode 107 and comprises a transition metal oxide having a higher oxygen content than the first region 115.

Now, a resistance changing phenomenon occurring in the resistance variable layer 106 will be described, using an oxygen-deficient tantalum oxide as an example. The resistance changing phenomenon occurring in the resistance variable layer with the oxygen-deficient transition metal oxide sandwiched between two electrodes is assumed to be attributed to the redox reaction of a tantalum oxide constituting a higher-oxygen-content layer (second region 116) in the vicinity of the interface between the second region 116 and the second electrode, as represented by the following formula:

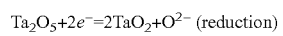

$Ta_2O_5 + 2e^- = 2TaO_2 + O^{2-}$ (reduction)

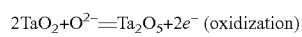

$2TaO_2 + O^{2-} = Ta_2O_5 + 2e^-$ (oxidization)

When a negative voltage is applied to the second electrode 107 on the basis of the first electrode 105, electrons are implanted into the second region 116, thereby resulting in a state where the redox reaction proceeds in the second region 116, and thereby $TaO_2$ is present in the second region 116. It is presumed that as a result of this, a lower-resistance state is formed. On the other hand, when a positive voltage is applied to the second electrode 107, the oxidization proceeds in the second region 116 due to migration of oxygen ions, thereby resulting in a state where $Ta_2O_5$ is present in the second region 116. It is presumed that as a result of this, a higher-resistance state is formed. To enable the redox reaction indicated by the above formula to proceed efficiently, it is important that a material used for the electrode layer (second electrode 107) closer to a region where the resistance changing phenomenon occurs has a higher standard electrode potential than the transition metal (Ta) constituting the resistance variable layer. The standard electrode potential is an index indicating a degree to which oxidization occurs less easily. When a value of a standard electrode potential of a certain material is higher, the material is oxidized less easily. The precious metal such as platinum (Pt) or iridium (Ir) has a higher standard electrode potential than another metal. Therefore, by placing the electrode having a higher standard electrode potential in close proximity to the layer which is allowed to change its resistance by the redox reaction, a large part of oxygen ions used in the redox reaction are used in the redox reaction in the resistance variable layer (second region 116). The standard electrode potential of Ta is −0.6V and the standard electrode potential of platinum is 1.19V. There is a potential difference of 1 V or greater, and therefore, it is considered that the reaction in the above formula proceeds efficiently.

When a difference in standard electrode potential between the electrode and the metal constituting the resistance variable layer in contact with the electrode is greater, resistance changing operation takes place more easily, while when the difference is smaller, the resistance changing operation takes place less easily. Therefore, it is presumed that the degree to which the electrode material is oxidized less easily or the degree to which the metal constituting the resistance variable layer is oxidized more easily plays an important role in a mechanism of the resistance changing phenomenon. In view of this, a precious metal element such as platinum, palladium (Pd) or iridium which has a higher standard electrode potential, and alloy comprising a combination of these precious metal elements, is used effectively, as the material of the electrode (second electrode 107) closer to the region where the resistance changing phenomenon takes place (i.e., located on the second region 116 side).

As used in the specification and claims, "alloy" may include a configuration in which a plurality of precious metals are formed into an electrode comprising "alloy" deposited by mixing the plurality of precious metals by sputtering during formation of the electrode, as well as a configuration in which an electrode is formed to comprise "alloy" composed of a plurality of precious metals.

As the resistance variable layer 106, a hafnium (Hf) oxide, a zirconium (Zr) oxide, etc., may be used, instead of the tantalum oxide. When resistance variable layers are formed using the hafnium oxide, the zirconium oxide, etc., such that they are different in oxygen content and are stacked together, and electric pulses with different polarities are applied, a redox reaction similar to the above takes place, and a resistance changing phenomenon takes place, as in the case of the tantalum oxide of the present embodiment. An electrode material in the case of using the resistance variable layer comprising the hafnium oxide, the zirconium oxide, etc., may be selected as described above. The same material or different materials may be used as first transition metal constituting the first region 115 of the resistance variable layer 106 and second transition metal constituting the second region 116 of the resistance variable layer 106. Since the transition metal can assume a plurality of oxidization states, different resistance states can be implemented by the redox reaction. When different materials are used as the first transition metal and the second transition metal, the standard electrode potential of the second transition metal is preferably lower than the standard electrode potential of the first transition metal. This is because the resistance changing phenomenon is assumed to take place in such a manner that the redox reaction takes place in a minute filament formed within the second region 116 having a higher resistance, and its resistance value changes.

The oxide comprising the second transition metal preferably has a higher dielectric constant than the oxide comprising the first transition metal. Or, the oxide comprising the second transition metal preferably has a smaller band gap than the oxide comprising the first transition metal. By using, as the resistance variable layer 106, the oxide comprising the first transition metal and the oxide comprising the second transition metal, which satisfy one or both of the above conditions, an insulation breakdown strength of the second region 116 can be made smaller than an insulation breakdown strength of the first region 115, and thereby an initial breakdown voltage can be decreased.

This is due to the fact that there is a correlation between insulation breakdown strength of an oxide layer and a dielectric constant of the oxide layer, in which the insulation breakdown strength decreases as the dielectric constant increases, as illustrated in FIG. 1 of J, McPherson et al., IEDM 2002, p. 633-636. Also, the above is because there is a correlation between the insulation breakdown strength of the oxide layer and a band gap of the oxide layer, in which the insulation breakdown strength increases as the band gap increases, as illustrated in FIG. 2 of J. McPherson et al., IEDM 2002, p. 633-636.

Figure 11:
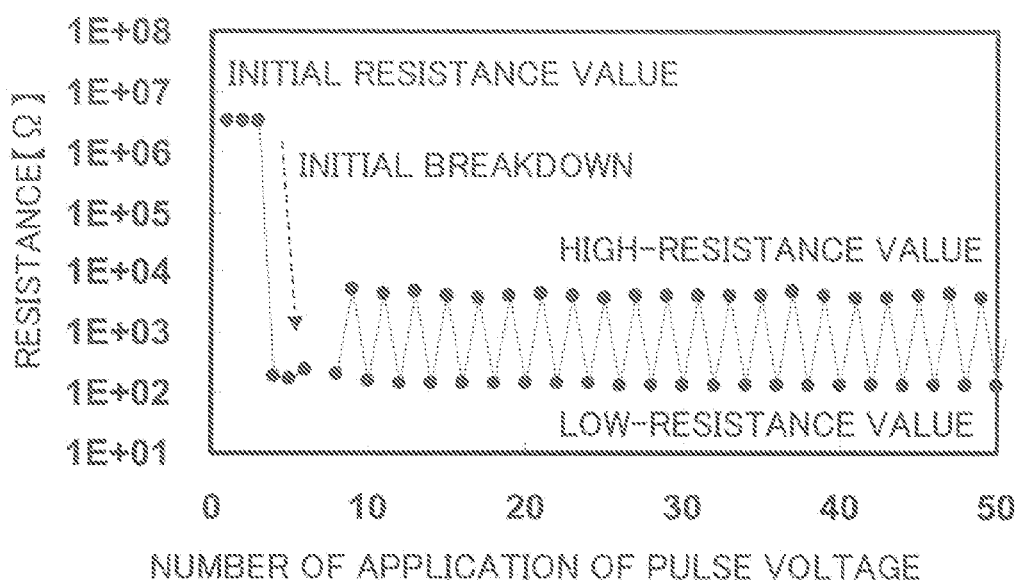
FIG. 11 is a graph showing the relationship between a resistance value of a resistance variable layer of a nonvolatile memory element, and the number of application of a pulse voltage.

In a case where the transition metal oxide such as the oxygen-deficient tantalum oxide having a stacked-layer structure is used as the resistance variable layer 106, the nonvolatile memory element just after manufacture has a very high initial resistance because of the presence of the second region 116 as an insulator. Therefore, the resistance variable layer 106 cannot change its resistance by applying a normal resistance changing voltage pulse without performing any pre-processing. To enable the resistance variable layer 106 to exhibit a resistance changing characteristic, it is necessary to form a conductive path (causes breakdown) in the resistance variable layer 106 (second region 116) by applying an electric pulse (initial breakdown voltage) higher than a voltage for causing the resistance variable layer 106 to change its resistance in a normal resistance changing operation, to the resistance variable layer 106 in an initial state. Such pre-processing is called initial breakdown. FIG. 11 is a graph showing the relationship between the resistance value of the resistance variable layer of the nonvolatile memory element, and the number of application of the pulse voltage. As shown in FIG. 11, in the initial breakdown, an initial breakdown voltage is applied to the resistance variable layer 106 to flow a current through the second region 116 which is a higher-oxygen-content layer (i.e., higher-resistance layer) of the resistance variable layer 106 so that the resistance value of the second region 116 is adjusted to be changed from a very high initial resistance value (about $1\times10^6$ to $1\times10^8 \Omega$) to a low resistance value ($1\times10^2$ to $1\times10^4 \Omega$) which enable the resistance change to occur (initial breakdown).

The conductive path formed by the initial breakdown has a filament-like shape. It has been confirmed that the conductive path has a diameter of about 10 nm. That is, by forming the filament-like conductive path in the second region 116 of the resistance variable layer 106 which is the insulator, an electrically-conductive state is established between the second electrode 107 and the first region 115 of the resistance variable layer 106. A cross-sectional area of a horizontal cross-section of the conductive path is smaller than a cross-sectional area of a horizontal cross-section (e.g., about 200 nm square) of the plug 103, and it cannot be predicted which location of the horizontal cross-section the conductive path is formed.

Figure 16:
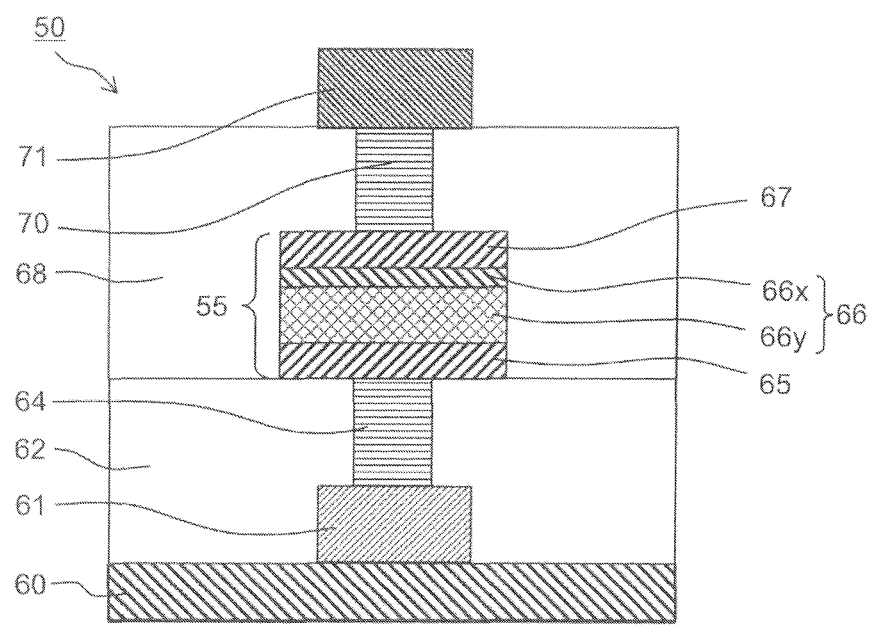
FIG. 16 is a cross-sectional view showing a configuration of a resistance variable nonvolatile memory device disclosed in Patent Literature 1.

By comparison, in the case of a structure shown in FIG. 16, in a cross-point nonvolatile memory device, the surface of the plug 64 forms a recess on the surface of the interlayer insulating layer 62, the resulting level difference is transferred to the resistance variable element 55 (especially, second region 66x), and a bent portion is locally generated in the second region 66x. This causes non-uniformity in initial breakdown voltages in some cases. If the resistance variable layer 55 is significantly misaligned with the plug 64, a bent portion is locally generated in the resistance variable layer 55, which causes non-uniformity in initial breakdown voltages in some cases.

Figure 13:
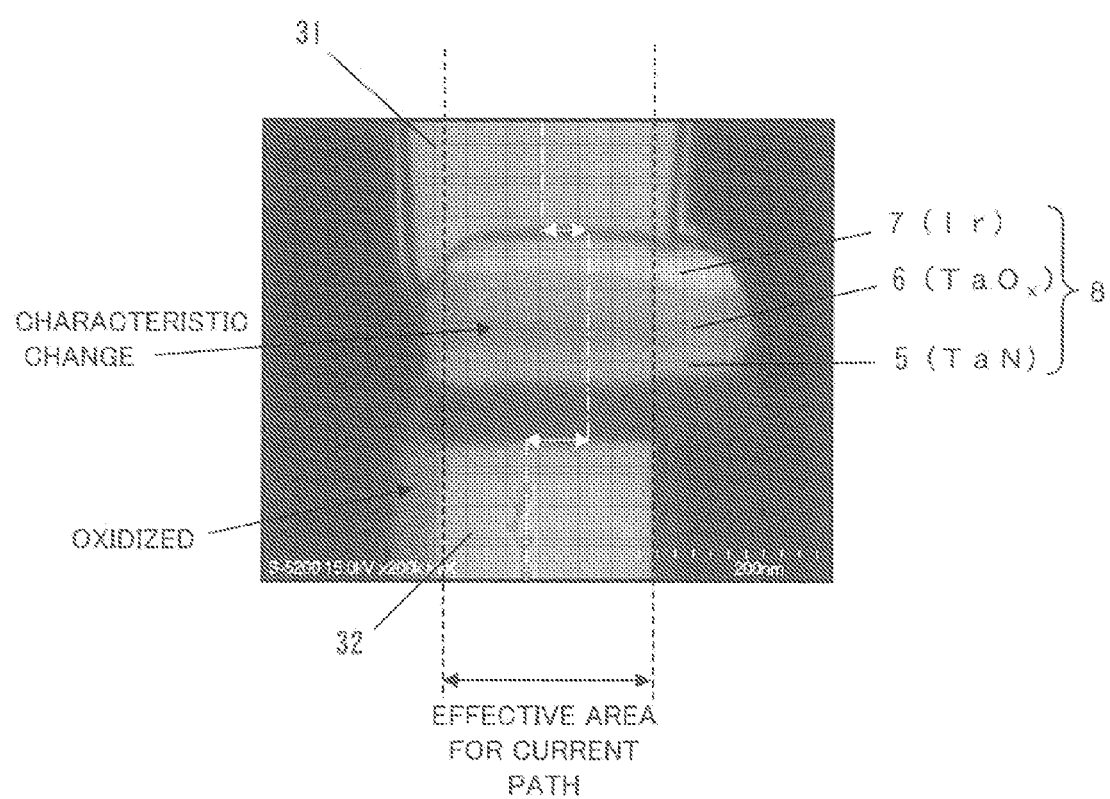
FIG. 13 is a view showing a scan electron microscope image in a case where the nonvolatile memory element formed between upper and lower plugs is in misalignment with the plugs.

FIG. 13 is a view showing a scan electron microscope image in a case where a nonvolatile memory element 8 formed between upper and lower plugs 31 and 32 is misaligned with the plugs 31 and 32. In FIG. 13, an upper electrode 7 comprises iridium, a lower electrode 5 comprises a tantalum nitride, and a resistance variable layer 6 comprising an oxygen-deficient tantalum oxide is formed between the upper electrode 7 and the lower electrode 5. In a region of the resistance variable layer 6 which is in contact with the upper electrode 7, a higher-resistance tantalum oxide layer (corresponding to the second region 116) is formed (not shown). As can be seen from the image of FIG. 13, the resistance variable layer 6 is misaligned with the lower plug 32, and a local characteristic change (estimated as oxidized) due to the misalignment occurs in the resistance variable layer 6 and the lower plug 32. The property change in the resistance variable layer 6 and the plugs 31 and 32 may possibly cause non-uniformity in effective dimensions and areas of portions of elements in which a current flows.

If non-uniformity occurs in effective dimensions and areas of portions of elements in which a current flows, non-uniformity occurs in magnitudes of the currents flowing through the elements, and hence non-uniformity occurs in the initial breakdown voltages, during the initial breakdown.

In the nonvolatile memory element 108 of the present embodiment, the resistance variable layer 106 is free from a locally bent portion due to the recess or misalignment of the lower plug, and is formed on a flat base layer. Thus, the nonvolatile memory element 108 has a stacked-layer structure in which the first electrode, the second electrode, and the resistance variable layer are stacked together such that they are parallel to the main surface of the substrate and are planarized. To be more specific, the nonvolatile memory element 108 has a structure in which the first electrode 105, the resistance variable layer 106 and the second electrode 107 are stacked together such that an interface between the first electrode 105 and the resistance variable layer 106 and an interface between the second electrode 107 and the resistance variable layer 106 are parallel to the main surface of the substrate 117 and are planarized. The current controlling element 112 is formed to underlie the nonvolatile memory element 108, thereby constituting the memory cell 104. The respective layers of the current controlling element 112 are stacked together such that these layers are planarized. In addition, the nonvolatile memory device of the present invention includes a plug (via) 103 connected in series with the memory cell 104 having the stacked-layer structure. The plug 103 is filled with, for example, copper. The first wire 101 and the memory cell 104 having the stacked-layer structure are connected to each other via the plug 103, while the second wire 102 and the memory cell 104 having the stacked-layer structure are directly connected to each other. By optimizing the thicknesses of the layers constituting the stacked-layer structure by adjusting the height of the plug 103, a distance between the first wire 101 and the second wire 102 is optimized, a value of a parasitic capacitance between the wires and a value of a parasitic resistance of the plug are optimized, and an operation speed and electric power consumption are optimized.

An area (first area) S1 of an end surface (surface taken along Z-Z' in FIG. 2) of the plug 103 which contacts the memory cell 104 having the stacked-layer structure is set greater than a cross-sectional area (second area) S2 of a horizontal cross-section (surface taken along Y-Y' in FIG. 2 and being parallel to the main surface of the semiconductor substrate 117) of the resistance variable layer 106. That is, in the present embodiment, the area (first area) S1 of the end surface of the plug 103 which contacts the memory cell 104 having the stacked-layer structure is set greater than the cross-sectional area (second area) S2 of the horizontal cross-section of the overall memory cell 104 having the stacked-layer structure. By setting the first area S1 of the plug 103 greater than the second area S2 of the resistance variable layer 106 in this way, the base layer portion of the memory cell 104 is constituted by only the plug 103, the memory cell 104 having the stacked-layer structure, especially the resistance variable layer 106 is allowed to constitute the memory cell 104 having the stacked-layer structure such that it does not protrude outward from the upper surface of the plug 103, and the interface between the resistance variable layer 106 and the upper electrode 107 can be planarized. This makes it possible to suppress non-uniformity in the initial breakdown voltages. The area (first area) S1 of the end surface of the plug 103 which contacts the memory cell 104 is greater than a sum of the cross-sectional area (second area) S2 of the horizontal cross-section of the resistance variable layer 106 and an area of a misalignment margin in formation of the resistance variable layer. By setting the area S1 in this way, the recess associated with the plug is not generated, and the respective layers of the memory cell 104 do not protrude outward from the upper surface of the plug 103 which is the base layer. This allows the overall resistance variable layer to be planarized. Since the respective layers of the memory cell 104 have flat surfaces (surfaces parallel to the main surface of the substrate 117), an electric force line generated between the first electrode 105 and the second electrode 107 of the memory cell 104 is perpendicular to the surface parallel to the main surface of the substrate 117, during application of voltages. If the electric force line is bent, the initial breakdown occurs unstably. Because of this, the electric force line of the current flowing between the electrodes preferably passes through the plug 103 straightly. In other words, by setting the cross-sectional area of the horizontal cross-section of the lower plug 103 which allows formation of the conductive path, relatively greater than the horizontal cross-section of the resistance variable layer 106, the density of the current flowing though the resistance variable layer 106 can be increased by effectively utilizing the electric force line between the first electrode 105 and the second electrode 107, using a simple stacked-layer structure. This can lessen non-uniformity in the initial breakdown voltages. Furthermore, the density of the current flowing though the resistance variable layer 106 can be increased, when data is written to and read from the nonvolatile memory element 108. As a result, a high-speed operation of a memory array is achieved.

The non-uniformity occurring in the initial breakdown voltages is differed depending on an electrode material. Conventionally, as the electrode material of the nonvolatile memory element, precious metal such as platinum or iridium is often used. Through experiments, the inventors discovered that in a case where platinum or palladium which is about 20 to 50 nm in thickness is used as the electrode material, minute projections (hillocks) comprising the electrode material are formed to protrude from the electrode toward the resistance variable layer, by performing a heating step of about 400 degrees C. after formation of the electrode comprising platinum or palladium. On the other hand, in a case where iridium is used as the electrode material, the hillocks are less likely to be formed even when the heating step is performed. This is presumed that such a difference is due to a difference in physical property (thermal expansion coefficient and Yong's modulus) between platinum and iridium. The thermal expansion coefficient of platinum is $8.8\times10^{-6}$ (degrees $C.^{-1}$) which is greater than the thermal expansion coefficient $6.4\times10^{-6}$ (degrees $C.^{-1}$) of iridium. The Yong's modulus of platinum is $152\times10^9$ (N/m$^2$) which is smaller than the Yong's modulus $529\times10^9$ (N/m$^2$) of iridium. This implies that platinum is plastically deformed more easily due to a stress applied thereto than iridium. In other words, platinum has a property in which the hillocks are formed more easily in platinum in terms of heat and stress than iridium. Hillocks are formed easily in palladium having a physical property similar to that of platinum.

Figure 12A:
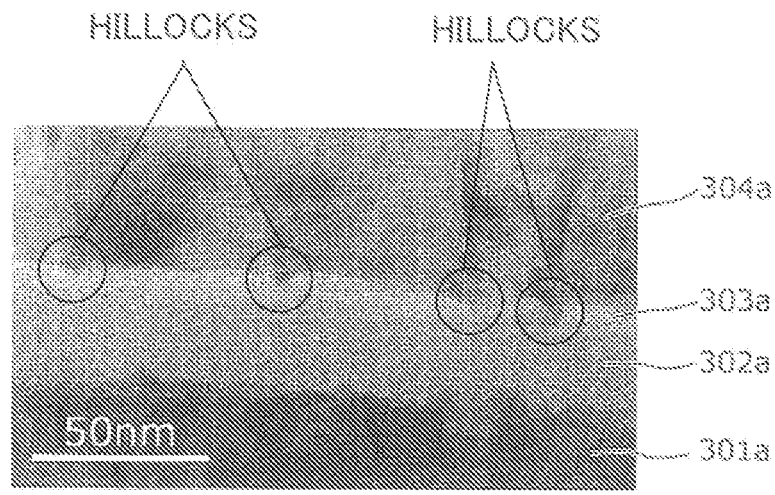
FIG. 12A is a view showing a TEM (transmission electron microscope) image of a cross-section of a portion in the vicinity of an upper electrode in a case where platinum is used as an upper electrode material of the nonvolatile memory element.
Figure 12B:
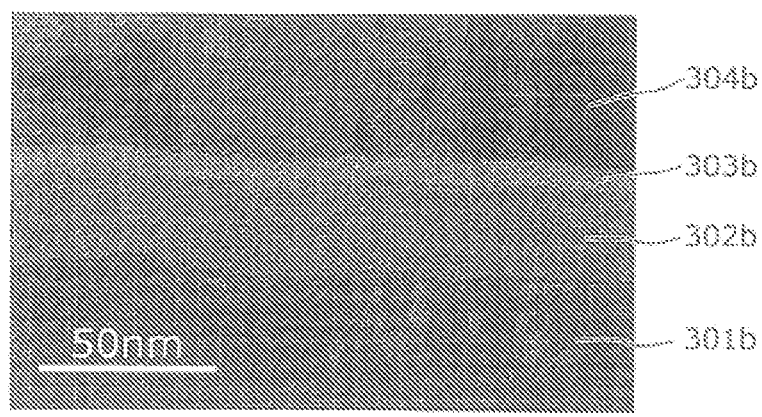
FIG. 12B is a view showing a TEM (transmission electron microscope) image of a cross-section of a portion in the vicinity of an upper electrode in a case where iridium is used as the upper electrode material of the nonvolatile memory element.

FIG. 12A and FIG. 12B are views showing TEM (transmission electron microscope) images of cross-sections of portions in the vicinity of the electrodes, respectively, in a case where platinum and iridium are used as the electrode material of the nonvolatile memory element. FIG. 12A shows the cross-section in a case where platinum is used as the electrode, while FIG. 12B shows the cross-section in a case where iridium is used as the electrode. In the example of FIG. 12A, a first resistance variable layer 302a (corresponding to the first region 115) and a second resistance variable layer 303a (corresponding to the second region 116) are stacked together between a lower electrode 301a and an upper electrode 304a. The second resistance variable layer 303a is a higher-oxygen-content layer. Platinum is used as the electrode material of the upper electrode 304a provided closer to the second resistance variable layer 303a. As shown in FIG. 12A, hillocks (indicated within circles shown in FIG. 12A) generated from the upper electrode 304a makes the second resistance variable layer 303a partially thinner. FIG. 12B shows the image of the nonvolatile memory element which is identical in structure to that of FIG. 12A except that the electrode material of the upper electrode 304b is iridium in the nonvolatile memory element in FIG. 12B (in FIG. 12B, reference symbol "a" in FIG. 12A is replaced by reference symbol "b"). The second resistance variable layer 303b has a uniform thickness and no hillocks are formed in the upper electrode 304b. Therefore, by using a material which does not cause hillocks, as the electrode, it is possible to suppress non-uniformity in the initial breakdown voltages. Even in a case where platinum or palladium is used as the electrode material, it is possible to suppress a stress generated in the electrode layer, and prevent the hillocks from being formed in the electrode layer, by setting the thickness to 10 nm or less.

In the present embodiment, by using iridium or alloy (especially, alloy containing iridium as a major component) of iridium and another precious metal, or platinum or palladium of 10 nm or less in thickness, as the electrode material of the second electrode 107, it is possible to suppress non-uniformity in the initial breakdown voltages.

Figure 14:
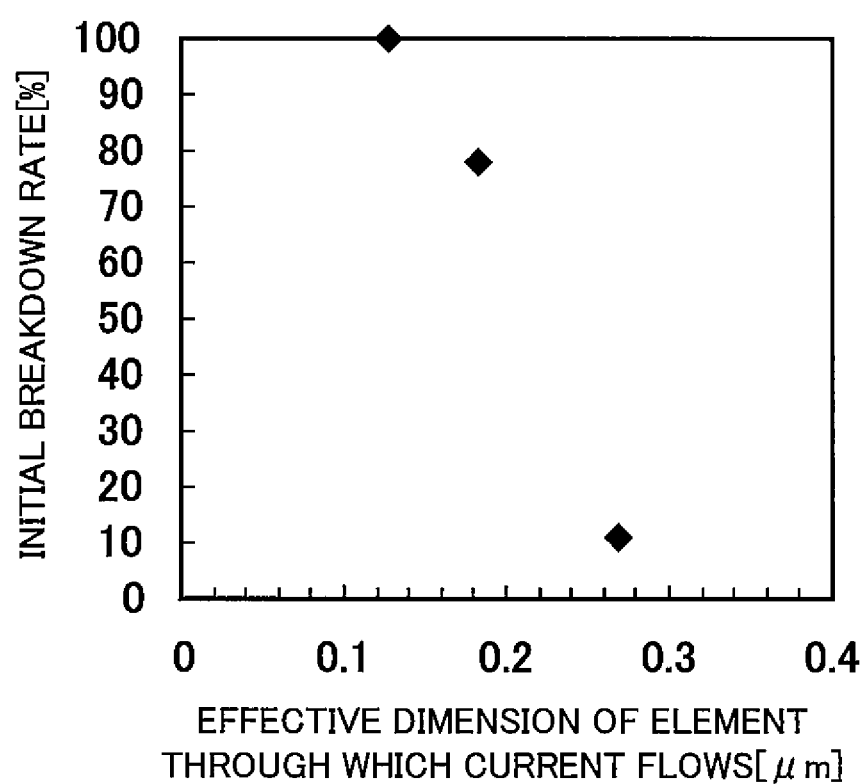
FIG. 14 is a graph showing the relationship between an effective dimension of a portion of the element through which a current flows and an initial breakdown rate in a horizontal cross-section of the resistance variable layer of the nonvolatile memory element.
Figure 15:
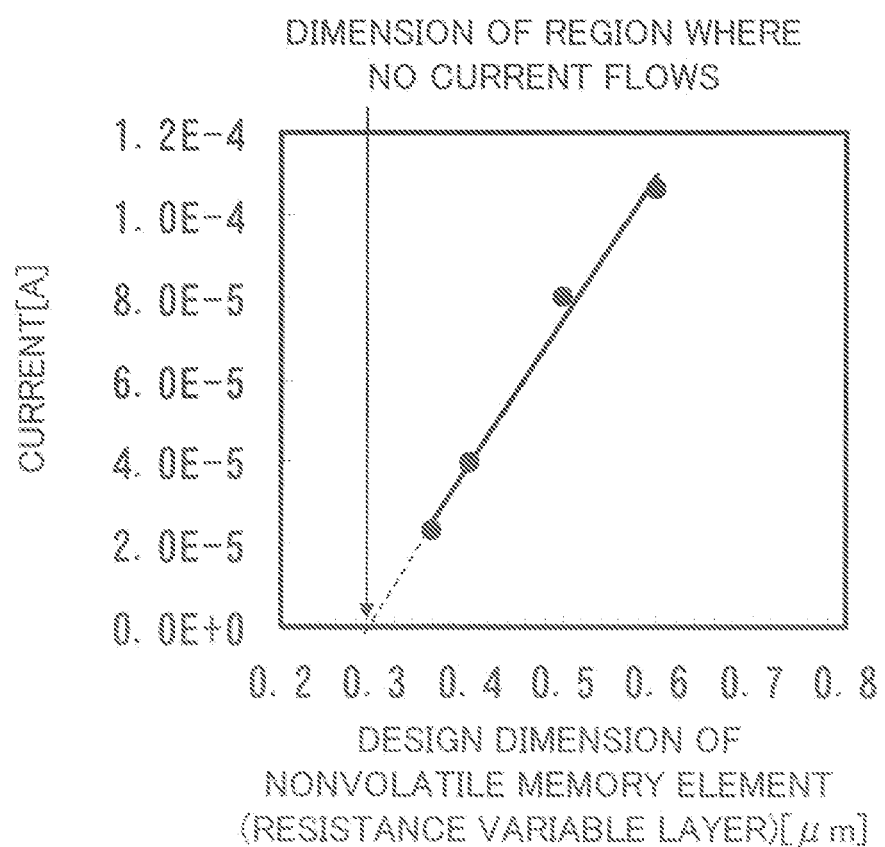
FIG. 15 is a graph showing a method for deriving the effective dimension used in FIG. 14.

FIG. 14 is a graph showing the relationship between effective dimension (dimension of one side of a square in a case where a resistance variable layer has a square shape) of the resistance variable layer through which a current flows and an initial breakdown rate, in a horizontal cross-section of the resistance variable layer. The effective dimension is defined as an average dimension in one direction of the cross-sectional area for determining a current density, which is calculated and estimated from an electric characteristic, and contributes to formation of the current path during the initial breakdown. In the example of FIG. 14, to obtain the resistance variable layer having an effective dimension smaller than a design dimension, a side wall of the resistance variable layer is oxidized after the resistance variable element is formed. The wordings "a side wall of the resistance variable layer is oxidized" is a step of oxidizing an outer peripheral portion of the resistance variable element to form a higher-concentration-oxide layer in an outer peripheral portion of the resistance variable layer than its inner peripheral portion. By oxidizing the side wall, a peripheral portion of the resistance variable layer, which has been damaged by etching, is changed to a higher-resistance state to prevent a conductive path from being formed in the peripheral portion of the resistance variable layer. Concurrently, a current is allowed to concentrate in a center portion of the resistance variable layer during formation of the conductive path, thereby facilitating formation of the conductive path in the center portion of the resistance variable layer. FIG. 15 shows an example of how to derive the effective dimension. In FIG. 15, a horizontal axis indicates design dimensions of nonvolatile memory elements (resistance variable layers) having different dimensions, and a vertical axis indicates average values of currents flowing through the element. By plotting current values corresponding to the elements with different design dimensions, respectively, a curve (primary linear approximation curve) indicating dependency of the current value on the dimension is obtained. This curve is substantially linear. An intersection of an extrapolated line of the curve and the horizontal axis, i.e., a design dimension corresponding to a current value of 0, indicates a dimension (point corresponding to an effective element area of 0, offset dimension) of a region in which no electric current flows. Therefore, the effective dimension (dimension of one side of the square in the case where the shape of the resistance variable layer is assumed as the square) of a portion of the element in which a current flows, is indicated by a value derived by subtracting from the design dimension, a dimension of this region in which no current flows. From the curve of FIG. 15, it can be estimated that when the design dimension of one side is 0.5 μm, the effective dimension is 0.21 μm derived by subtracting an offset dimension 0.29 μm from 0.5 μm. It can be seen from FIG. 14 that, regarding the effective dimension (dimension of one side of the square in the case where the shape of the resistance variable layer is assumed as the square) of the portion of the element in which a current flows in the horizontal cross-sectional area of the resistance variable layer, as the effective dimension (dimension of one side of the square in the case where the shape of the resistance variable layer is assumed as the square) of the horizontal cross-section in which the current flows, is smaller, the initial breakdown rate is higher, i.e., the initial breakdown is performed more stably. In other words, to effectively make the initial breakdown rate higher, the density of the current flowing through the resistance variable layer is preferably higher (effective dimension, i.e., effective area of the cross-section of the resistance variable layer through which the current flows is smaller). The inventors of the present invention discovered such findings.

In the present embodiment, based on the above findings, the initial breakdown rate can be improved by oxidizing the side wall of the resistance variable layer 106 after the resistance variable element 108 is formed.

In the present embodiment, the nonvolatile memory device further includes the current controlling element 112 as a portion of the memory cell 104 having the stacked-layer structure. In other words, in the present embodiment, the memory cell 104 having the stacked-layer structure includes the nonvolatile memory element 108 and the current controlling element 112. The current controlling element 112 includes a third electrode 109, a fourth electrode 111, and a current controlling layer (e.g., semiconductor layer) 110 such that the current controlling layer 110 is sandwiched between the third electrode 109 and the fourth electrode 111. Thus, in the present embodiment, the current controlling element 112 constitutes a metal-semiconductor-metal (MSM) diode. The third electrode 109 comprises, for example, tantalum, tantalum nitride, titanium, titanium nitride, tungsten, tungsten nitride, oxygen-deficient tantalum oxide, etc., and has a thickness of 10 to 50 nm. In the present embodiment, the third electrode 109 comprises tantalum nitride and its thickness is set to 20 nm. The fourth electrode 111 comprises the same material as the third electrode 109, and has a thickness equal to that of the third electrode 109. The semiconductor layer 110 comprises, for example, an nitrogen-deficient silicon nitride having a lower nitrogen concentration than a stoichiometric composition. When the nitrogen-deficient silicon nitride is expressed as $SiN_z$, $0<z\le0.85$ is satisfied. The semiconductor layer 110 has a thickness of 10 to 30 nm. In the semiconductor layer 110 of the present embodiment, z is 0.3, and its thickness is set to 20 nm. Alternatively, the current controlling element 112 may be constituted by a metal-insulator-metal (MIM) diode including an insulator layer in place of the semiconductor layer 110.

By forming the first electrode 105 of the nonvolatile memory element 108 and the fourth electrode 111 of the current controlling element 112 using the same material, they may be formed as an integrated common constituent. In this case, a thickness of the integrated common electrode may be set to 10 to 50 nm (e.g., 20 nm).

The current controlling element 112 is connected in series with the resistance variable layer 106 via the first electrode 105 and the fourth electrode 111. The current controlling element 112 is electrically connected to the resistance variable layer 106. The current controlling element 112 exhibits a non-linear current characteristic (has a region in which no current flows and a region in which a current flows) with respect to a voltage. In addition, the current controlling element 112 has a bidirectional current characteristic (the above non-linear current characteristic with respect to positive and negative voltages) with respect to the voltage. When the current controlling element 112 has a symmetric voltage-current characteristic in a positive range and a negative range, it is placed in an electrically conductive state at a predetermined threshold voltage Vf (electrically conductive state at a voltage which is not lower than +Vf and not higher than −Vf on the basis of one electrode).

Thus, the cross-sectional area S2 of the cross-section of the resistance variable layer 106 which is taken along Y-Y' is smaller than the cross-sectional area S1 of the cross-section of the end surface of the plug 103 which is taken along Z-Z'. Therefore, the entire memory cell 104 can be located inward relative to the plug 103 even when the plug 103 and the memory cell 104 having the stacked-layer structure are misaligned with each other, or non-uniformity occurs in dimensions of the memory cells 104 having the stacked-layer structure. Because of this, the density of the current flowing through the nonvolatile memory element 108 during the initial breakdown is determined by the cross-sectional area of the resistance variable layer 106, and is not affected by the misalignment. As a result, it is possible to lessen non-uniformity occurring in densities of the currents flowing through the nonvolatile memory element 108, lessen electric failure, prevent reduction of yield, and improve reliability.

As shown in FIG. 1, when a minimum processing dimension of a wire width is F and a wire interval (pitch) is 2F, $4F^2$ is realized as an ideal area of a single nonvolatile memory element 108, when the area is expressed in a binary form (without use of multiple values). For example, the wire width F is 50 to 250 nm. When F is 200 nm, a dimension of one side of the first wire 101 and a dimension of one side of the second wire 102 at a cross-point of the first wire 101 and the second wire 102 are each 200 nm, and a dimension of one side of the plug 103 is 200 nm or less (it should be noted that the plug 103 as a finished constituent actually has a substantially circular shape, and its diameter is 200 nm or less). A misalignment amount depends on lithography equipment in which alignment is made. In the case of processing of the wire width F=200 nm, when a lithography process is performed by a KrF scanner, it is estimated that the misalignment amount is about 50 nm at maximum and non-uniformity in dimensions is 20 nm which about 10% of 50 nm. Therefore, by setting the dimension of the memory cell 104 having the stacked-layer structure to about 130 nm, the nonvolatile memory element can be formed with higher accuracy such that the nonvolatile memory element does not protrude outward from the plug 103. In this way, by setting the cross-sectional area of the plug 103 based on the wire width F, the area of the nonvolatile memory element 108 can be reduced, and a highly-integrated memory array can be manufactured.

(Manufacturing Method of Nonvolatile Memory Device of Embodiment 1)

Next, a manufacturing method of the nonvolatile memory device of Embodiment 1 will be described.

FIGS. 3A and 3B and FIGS. 4A and 4B are cross-sectional views schematically showing manufacturing process steps of the nonvolatile memory device shown in FIG. 1.

Figure 3A:
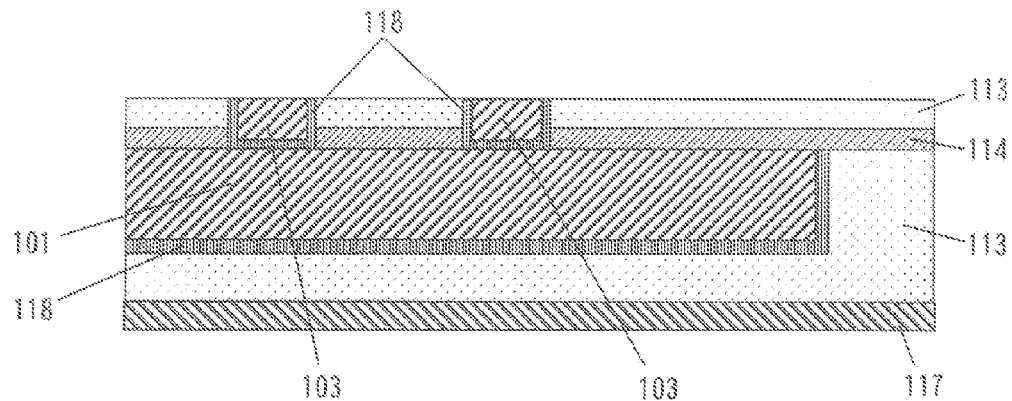
FIG. 3A is a cross-sectional view schematically showing a manufacturing process step of the nonvolatile memory device of FIG. 1.

Initially, in the step of FIG. 3A, the first wire 101 is formed on the semiconductor substrate 117, and the plug 103 is formed on the first wire 101 such that its upper surface area is a predetermined first area (step A). To be specific, the interlayer insulating layer 113 comprising silicon oxide (e.g., plasma TEOS) is deposited over the semiconductor substrate 117 by plasma CVD, etc. Then, a wire trench into which the first wire 101 is filled is formed in the interlayer insulating layer 113 by photolithography and dry etching. A barrier layer 118 comprising tantalum nitride (5 to 40 nm) and tantalum (5 to 40 nm), and a wire material copper (50 to 300 nm) are deposited into this wire trench, by sputtering, or the like. Then, by electroplating or the like, copper is further deposited on a copper seed layer so that the wire trench is fully filled with the wire material copper. Then, extra copper on the upper surface of the deposited copper is removed by CMP to planarize the upper surface of the interlayer insulating layer 113 and the upper surface of copper filled in the wire trench, thereby forming the first wire 101 (step a1). Then, an SiN layer is deposited with a thickness of about 30 to 200 nm by plasma CVD or the like, thereby forming the liner layer 114 such that the liner layer 114 covers the first wire 101. Then, the interlayer insulating layer 113 is further deposited over the liner layer 114. If necessary, the upper surface is planarized by CMP to lessen a level difference. Then, by photolithography and dry etching, a hole into which the plug 103 is filled is formed on a predetermined location of the first wire 101 such that the upper surface area is the predetermined first area (circle with a diameter of about 200 nm). Then, the barrier layer 118 comprising tantalum nitride (5 to 40 nm) and tantalum (5 to 40 nm), and the wire material copper (50 to 300 nm) are deposited into the hole, by sputtering or the like. Then, by electroplating or the like, copper is further deposited on a copper seed layer so that the hole is fully filled with the barrier layer 118 and copper, thereby forming the plug 103 (step a2). Then, extra copper on the upper surface of the deposited copper and a portion of the barrier layer 118 are removed by CMP to planarize the upper surface of the interlayer insulating layer 113 and the upper surface of the plug 103.

Figure 3B:
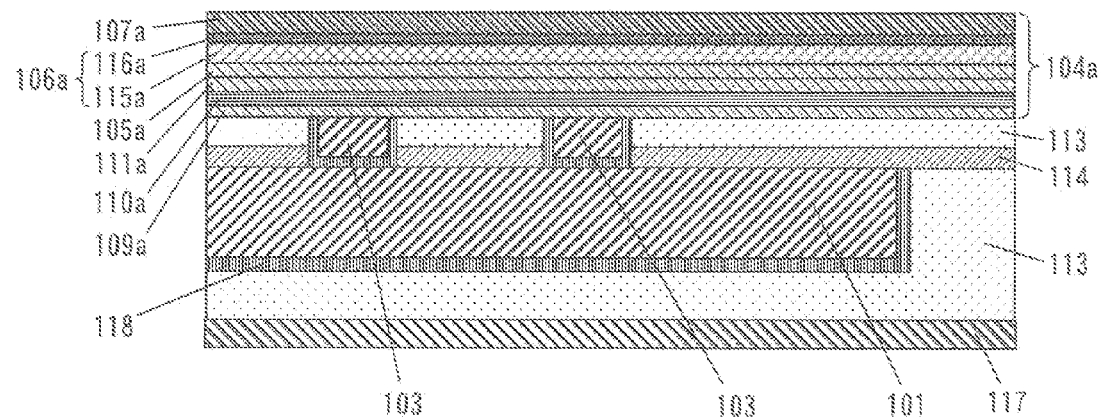
FIG. 3B is a cross-sectional view schematically showing a manufacturing process step of the nonvolatile memory device of FIG. 1.
Figure 4A:
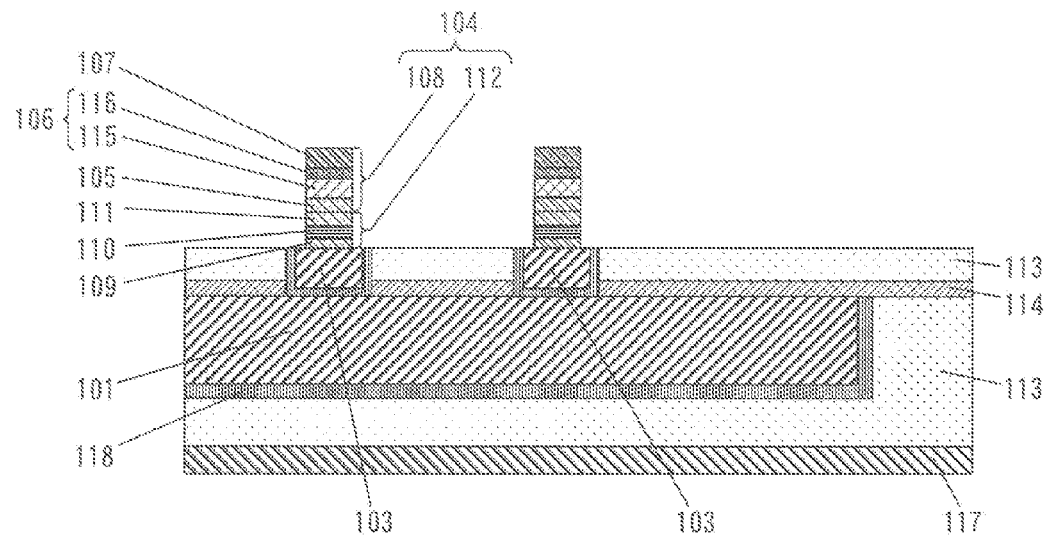
FIG. 4A is a cross-sectional view schematically showing a manufacturing process step of the nonvolatile memory device of FIG. 1.

Then, in the step of FIGS. 3B and 4A, the memory cell 104 having the stacked-layer structure including the current controlling element 112 and the nonvolatile memory element 108 is formed on the upper surface of the plug 103 (step B). Firstly, in the step of FIG. 3B, deposited over the entire surface including the plug 103 and the interlayer insulating layer 113, are, a third electrode layer 109a (10 to 100 nm in thickness, for example, 30 nm) comprising tantalum, tantalum nitride, titanium, or titanium nitride, (e.g., tantalum nitride), a nitrogen-deficient silicon nitride layer 110a (10 to 30 nm in thickness, for example, 20 nm) having a lower nitrogen concentration than a stoichiometric composition, a fourth electrode layer 111a and a first electrode layer 105a which are similar to the third electrode layer 109a, a conductive transition metal oxide layer 106a (10 to 100 nm in thickness, for example, 50 nm, 0.5 to 20 mΩ·cm in resistivity, e.g., 2 mΩ·cm) comprising tantalum, titanium, nickel, or the like (e.g., oxygen-deficient tantalum oxide), and a second electrode layer 107a (10 to 100 nm in thickness, for example, 50 nm) comprising precious metal such as platinum, iridium, palladium, ruthenium, or the like (e.g., iridium). These layers are horizontally stacked sequentially, thereby forming a stacked-layer constituent 104a. At this time, alternatively, tantalum nitride, titanium nitride, or titanium aluminum nitride (e.g., tantalum nitride) which is a conductive layer (not shown), may be further stacked horizontally on the second electrode comprising precious metal, as a hard mask used in dry etching, thereby forming the stacked-layer constituent 104a.

The first to fourth electrode layers 105a, 107a, 109a, and 111a and the conductive hard mask (not shown) may be deposited by sputtering or the like. The silicon nitride layer 110a is deposited by reactive sputtering in which sputtering is performed in argon and nitrogen atmosphere using a silicon target. The transition metal oxide layer 106a is deposited by reactive sputtering in which sputtering is performed in argon and oxygen atmosphere using a tantalum target. The resistivity of the transition metal oxide layer 106a can be adjusted to be 0.5 to 20 mΩ·cm by adjusting a flow rate of oxygen so that the oxygen concentration of the layer is controlled at 45 to 65 atm %. For example, by setting the oxygen concentration to 60 atm %, the transition metal oxide layer 106a (first region 115a having an electric conductivity) having a resistivity of about 2 mΩ·cm can be deposited (step b1). Further, the transition metal oxide layer 106a may be oxidized to form a $Ta_2O_5$ layer with a thickness of 2 to 12 nm on an uppermost layer of the oxygen-deficient transition metal oxide layer 106a (first region 115a), as the second region 116a which is an insulator having a higher oxygen content (step b2).

Then, in the step of FIG. 4A, the stacked-layer constituent 104a stacked horizontally is processed by photolithography and dry etching, to remove a portion of the stacked-layer constituent 104a, thereby forming the memory cell (current controlling element 112 and nonvolatile memory element 108) 104 having the stacked-layer structure which is independent of another memory cell 104 and has an island shape (square shape in horizontal cross-section in which one side is 100 to 400 nm, for example, one side is 250 nm) such that the memory cell 104 is connected to the plug 103 (step b3). At this time, by adjusting a pattern dimension of photolithography, a dry etching amount, etc., the memory cell 104 is formed such that the cross-sectional area of its entire horizontal cross-section is smaller than the area (first area) of the end surface of the plug 103 which contacts the memory cell 104 having the stacked-layer structure. For example, the memory cell 104 having the stacked-layer structure is formed to have a square shape (the memory cell 104 of a finished constituent may actually have a circular shape instead of the square shape) in which one side of the horizontal cross-section of the memory cell 104 having the stacked-layer structure is 130 nm when the diameter of the plug 103 is 200 nm. In this way, the stacked-layer structure can be formed, in which the resistance variable layer 106 is entirely planarized, and the first electrode 105 and the second electrode 107 are in contact with the resistance variable layer 106.

Figure 4B:
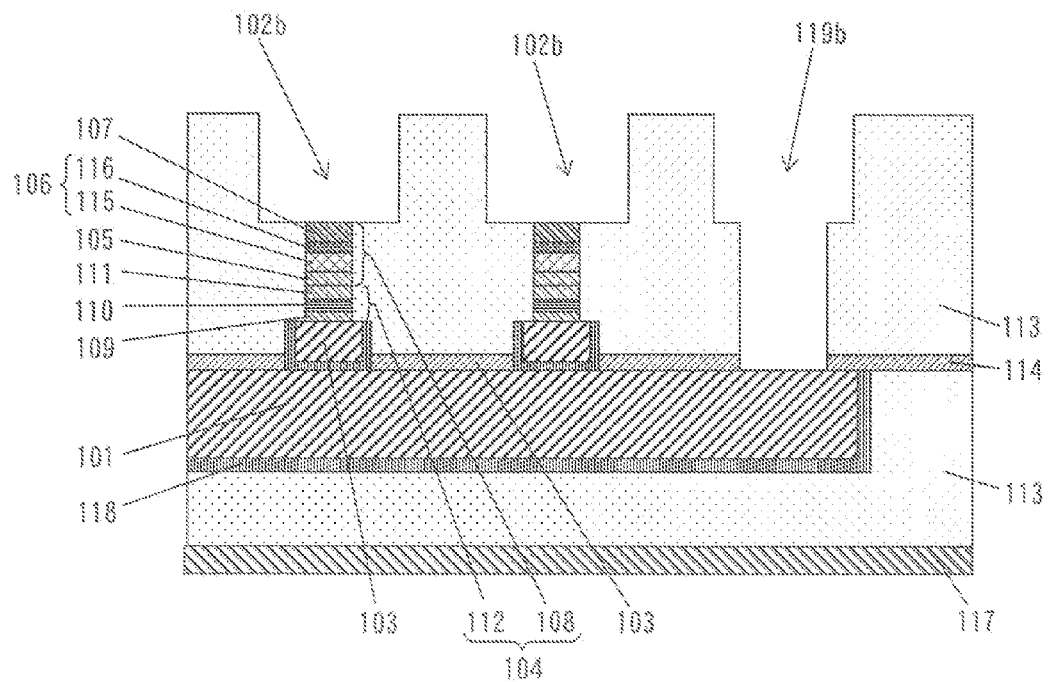
FIG. 4B is a cross-sectional view schematically showing a manufacturing process step of the nonvolatile memory device of FIG. 1.

Then, in the step of FIG. 4B and FIG. 2, the plurality of second wires 102 are formed on the memory cells 104 having the stacked-layer structure within a plane parallel to the main surface of the semiconductor substrate 117 such that the second wires 102 extend in parallel and three-dimensionally cross the plurality of first wires 101, respectively (step C). To be more specific, the second wire 102 is formed such that the second wire 102 is directly electrically connected to the second electrode 107 of the memory cell 104. Firstly, in the step of FIG. 4B, the interlayer insulating layer 113 is further deposited over the entire surface including the memory cell 104 having the stacked-layer structure, and the interlayer insulating layer 113 (step c1). Then, by photolithography and dry etching, portions of the interlayer insulating layer 113 are removed, to form a wire trench 102b into which the second wire 102 three-dimensionally crossing the first wire 101 is filled is formed on the memory cell 104 having the stacked-layer structure, and a hole 119b into which a wire connection plug 119 is filled is formed, on a predetermined region of the first wire 101, where the memory cell 104 having the stacked-layer structure is not formed (step c2). Typically, the hole for the plug 119 is formed by photolithography and dry etching in a first order, and then the wire trench for the second wire 102 is formed by photolithography and dry etching in a second order. However, the wire trench may be formed in a first order. In the present embodiment, after the hole into which the plug 119 is filled is formed, etching is performed to expose the upper surface of the memory cell 104 having the stacked-layer structure, to be precise, the second electrode 107, thereby forming the wire trench into which the second wire 102 is filled. When an electrically-conductive hard mask (not shown) is formed, etching is performed to expose the hard mask, thereby forming the wire trench. At this time, the hard mask may be etched away completely. The hard mask had better be etched away completely, because a parasitic resistance of the wire can be made low and non-uniformity in contact resistances can be lessened, as compared to a case where the hard mask is left. Then, using conditions similar to those used when the first wire 101 is filled, the barrier layer 118 comprising tantalum nitride (5 to 40 nm) and tantalum (5 to 40 nm), and the wire material copper (50 to 300 nm) are deposited into the wire trench and the hole, by sputtering or the like. Then, by electroplating or the like, copper is further deposited on a copper seed layer so that the wire trench is fully filled with the wire material copper. Then, extra copper on the upper surface of the deposited copper and a portion of the barrier layer 118 are removed by CMP to planarize the upper surface of the interlayer insulating layer 113 and the upper surface of the second wire 102, thereby forming the second wire 102 (step c3). Then, as shown in FIG. 2, a silicon nitride layer is deposited with a thickness of about 30 to 200 nm, for example, about 50 nm, by plasma CVD or the like, thereby forming the liner layer 114 such that the liner layer 114 covers the second wire 102.

Since the second electrode 107 of the memory cell 104 which is at an opposite side of the plug 103 is directly electrically connected to the second wire 102, reduction of the density of the current flowing through the memory cell 104 during initial breakdown can be suppressed as compared to a configuration in which plugs are provided on both sides of the memory cell 104, respectively. If a plug (upper-layer plug) is provided on the memory cell 104 which is at an opposite side of the plug 103, misalignment of the upper plug with respect to the memory cell 104 is likely to occur. This would make it difficult to keep a current flowing through the memory cell 104 during initial breakdown at a high density. Also, the plug itself may become a parasitic resistance component, and may possibly impede stability of the current density. Therefore, by configuring the constituents such that the area of the surface of the plug 103 at one side of the memory cell 104, which is parallel to the main surface of the substrate 117, is made greater than the cross-sectional area of the surface of the first region 115 of the resistance variable layer 106, which is parallel to the main surface of the substrate 117, and the second electrode 107 of the memory cell 104 which is at the other side of the memory cell 104, is directly connected to the second wire 102, non-uniformity in densities of a current flowing through the memory cell 104 is lessened, and hence electric failure is lessened. This can prevent reduction of yield, and improve reliability. Furthermore, the number of manufacturing process steps can be reduced, and cost can be reduced, because of absence of the upper plug.

Although in the present embodiment, the second electrode 107 of the resistance variable layer 106 comprises iridium, the present invention is not limited to this, but the second electrode 107 may comprise, for example, alloy of iridium and another precious metal (e.g., platinum) (content of another precious metal is 50 atm % or less). If the electrode on a higher-degree-oxidization layer (second region 116) side of the resistance variable layer 106 comprises the alloy, reduction and non-uniformity of initial resistance values can be suppressed, and an initial breakdown voltage can be suppressed to a low one.

Figure 17:
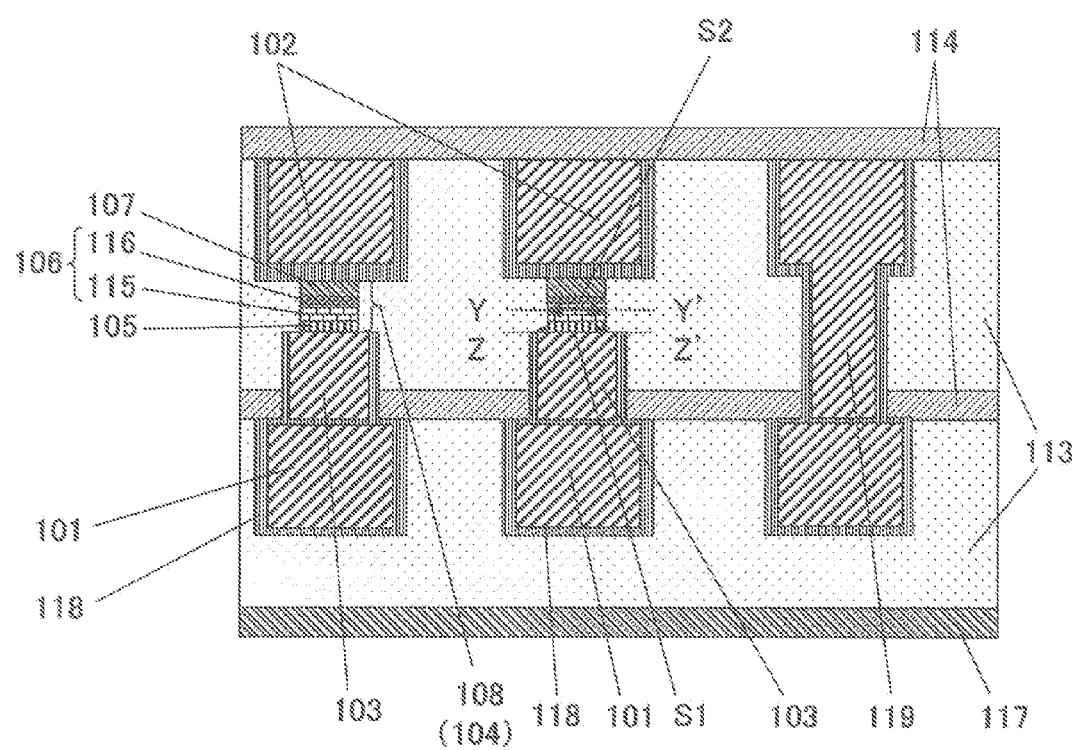
FIG. 17 is a cross-sectional view of a nonvolatile memory element having a basic configuration of the present invention.

Although the configuration of the above embodiment has been described regarding the memory cell 104 having the stacked-layer structure of the current controlling element 112 and the nonvolatile memory element 108, and the plug 103, the present invention is not limited to this, but other configuration may be used so long as at least the nonvolatile memory element 108 and the plug 103 are provided, as shown in FIG. 17. In that case, one end of the plug 103 is connected to one end of the nonvolatile memory element 108. The other end of the plug 103 or the other end of the nonvolatile memory element 108 may be connected to a source or drain of an access transistor provided separately.

Modified Example of Embodiment 1

Figure 5:
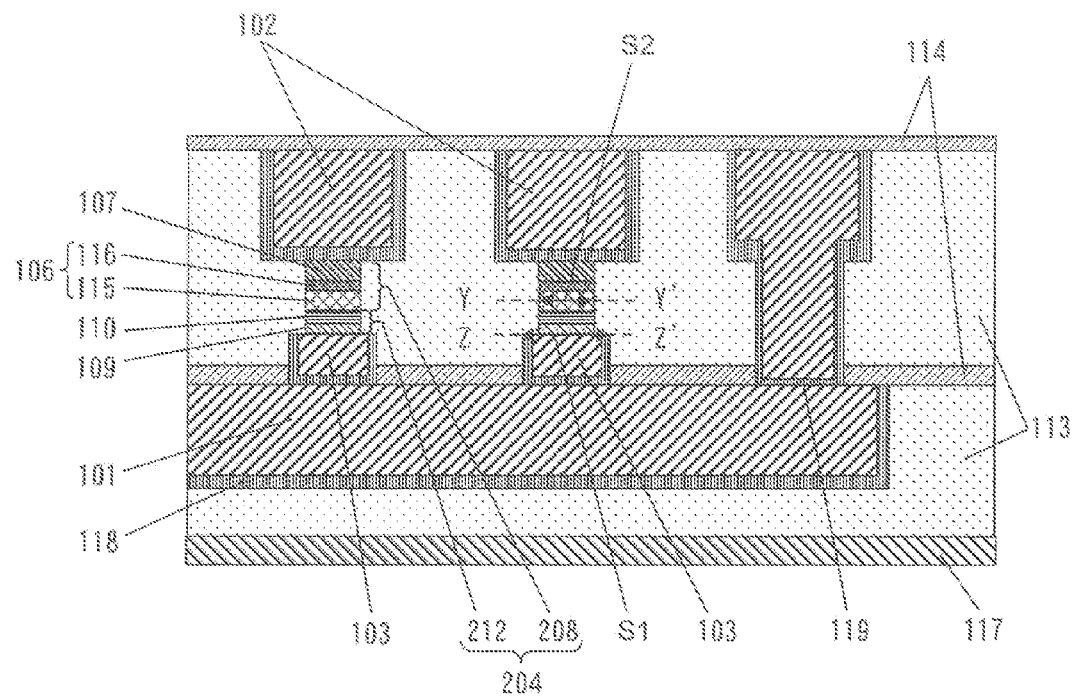
FIG. 5 is a cross-sectional view showing a configuration of a modified example of the nonvolatile memory device according to Embodiment 1 of the present invention.

Hereinafter, a modified example of Embodiment 1 will be described. FIG. 5 is a cross-sectional view showing a configuration of a modified example of the nonvolatile memory device according to Embodiment 1 of the present invention. FIG. 5 shows a cross-section similar to the cross-section taken along line II-II' in FIG. 1. In FIG. 5, the same constituents as those of FIG. 2 are identified by the same reference symbols and will not be described in repetition.

As shown in FIG. 5, the present modified example is different from the example of FIGS. 1 and 2 in that an intermediate electrode is omitted from a memory cell 204 having a stacked-layer structure. In other words, a nonvolatile memory element 208 of the modified example does not include the first electrode 105 in the example of FIG. 2, and a current controlling element 212 of the modified example does not include the fourth electrode 111 in the example of FIG. 2. Therefore, the resistance variable layer 106 (first region 115 of the resistance variable layer 106) of the nonvolatile memory element 208 is formed on the semiconductor layer 110 of the current controlling element 212. The other layers of the stacked-layer structure 204 are similar to those of the example of FIG. 2.

As a result, the stacked-layer structure 204 includes four layers stacked together and has a thickness of about 140 nm. The stacked-layer structure 204 is simpler and thinner than the memory cell 104 (including six layers and having a thickness of 190 nm) having the stacked-layer structure in the example of FIG. 2. This makes it possible to lessen an influence of a parasitic resistance and control a current density easily. In addition, this makes it possible to improve processing accuracy and lessen non-uniformity in dimensions. Since non-uniformity in the densities of the currents flowing through the nonvolatile memory element 208 is lessened, electric failure can be lessened, reduction of yield can be prevented, and reliability can be improved.

Embodiment 2

Figure 6:
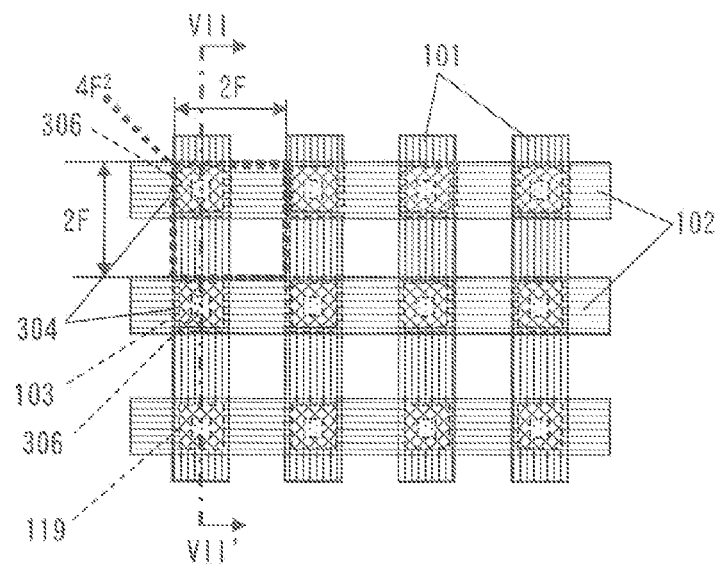
FIG. 6 is a plan view showing a configuration of a nonvolatile memory device according to Embodiment 2 of the present invention.
Figure 7:
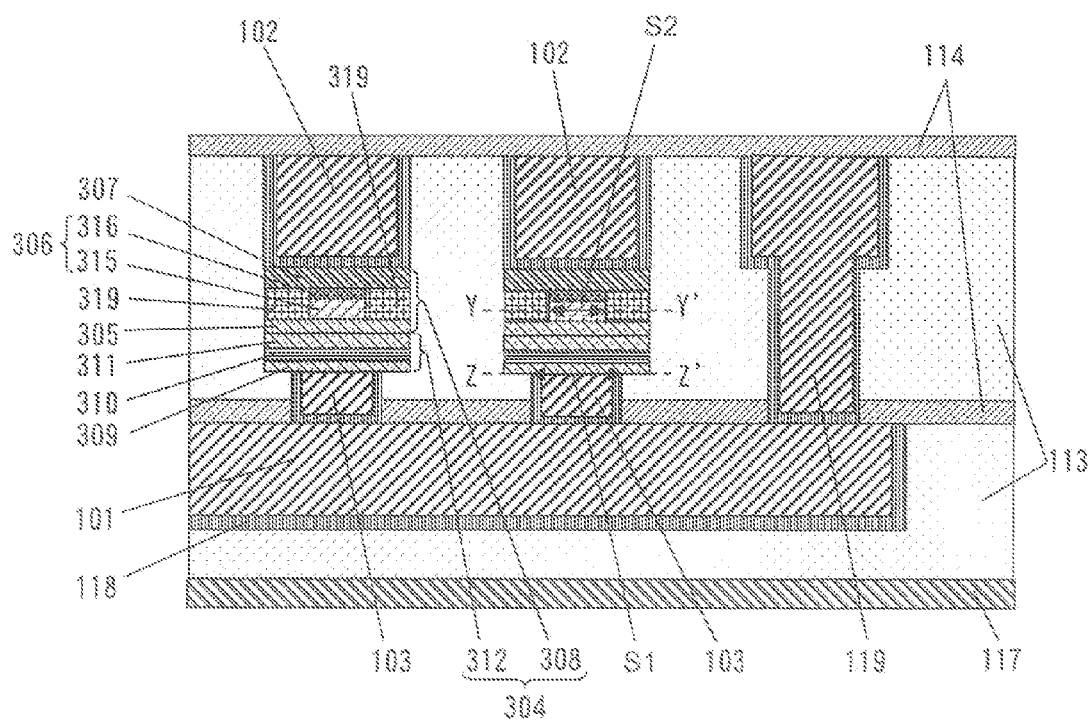
FIG. 7 is a cross-sectional view of the nonvolatile memory device taken along line VII-VII' in FIG. 6.

Hereinafter, Embodiment 2 of the present invention will be described. FIG. 6 is a plan view showing a configuration of a nonvolatile memory device according to Embodiment 2 of the present invention. FIG. 7 is a cross-sectional view of the nonvolatile memory device taken along line VII-VII' in FIG. 6. In FIGS. 6 and 7, the same constituents as those of FIGS. 1 and 2 are designated by the same reference symbols and will not be described in repetition.

The present embodiment is different from Embodiment 1 in that a resistance variable layer 306 of the nonvolatile memory element 308 includes a first region 315 which is in contact with a first electrode 305 and comprises an oxygen-deficient transition metal oxide, a second region 316 which is in contact with a second electrode 307 and comprises a transition metal oxide having a higher oxygen content than the first region 315, and a third region 319 which is provided to cover the side surface of the first region 315 and the side surface of the second region 316 and is an insulator comprising a transition metal oxide having a higher oxygen content than the first region 315. The third region 319 is sandwiched between the first electrode 305 and the second electrode 307. An area (first area) S1 of an end surface (Z-Z') of the plug 103 which contacts the memory cell 304 having the stacked-layer structure including the resistance variable layer 306 is greater than a cross-sectional area (second area) S2 of a horizontal cross-section (Y-Y') of the first region 315 and of the second region 316, and is smaller than an area of the surface of the first electrode 305 and of the surface of the second electrode 307 which are parallel to the main surface of the substrate 117.

In the present embodiment, as shown in FIG. 6, the stacked-layer structure 304 formed at a three-dimensional cross-point of the first wire 101 and the second wire 102 has a cross-sectional area ($F^2$) of a square whose one side is a wire width F. That is, the stacked-layer structure 304 (particularly first electrode 305 and second electrode 307) is configured to have a cross-sectional area equal to or greater than that of the plug 103 formed at the three-dimensional cross-point of the first wire 101 and the second wire 102. However, the third region 319 through which an electric current does not flow easily is formed in a side wall of the resistance variable layer 306, and therefore, an effective cross-sectional area of a horizontal cross-section of a portion of the resistance variable layer 306 where initial breakdown may occur is smaller than an area of an end surface of the plug 103 which contacts the memory cell 304 having the stacked-layer structure.

The third region 319 comprises a transition metal oxide ($Ta_2O_5$ substantially having a stoichiometric composition in the present embodiment) which is an insulator having a higher oxygen content than the first region 315.

In the above configuration, the density of the current flowing through the nonvolatile memory element 308 during initial breakdown is determined by the cross-sectional area of the first and second regions 315 and 316 surrounded by the third region 319 which is an insulator. Therefore, an effective cross-sectional area of a portion where initial breakdown may occur can be reduced, and hence, initial breakdown is less affected by misalignment with the plug 103. As a result, non-uniformity in densities of the current flowing through the nonvolatile memory element 308 is lessened, and hence electric failure is lessened. This can prevent reduction of yield, and improve reliability. In addition, since the cross-sectional area of the plug 103 is set based on the wire width F, an effective area of the nonvolatile memory element 308 can be reduced, and a highly-integrated memory array can be formed.

In the present embodiment, like Embodiment 1, a current controlling element 312 is formed as the memory cell 304 having the stacked-layer structure. The current controlling element 312 includes a third electrode 309 which contacts the plug 103, a fourth electrode 311 which contacts the first electrode 305 of the nonvolatile memory element 308, and a semiconductor layer 310 sandwiched between the third electrode 309 and the fourth electrode 311. As described above, since the memory cell 304 having the stacked-layer structure has a cross-sectional area ($F^2$) of a square whose one side is the wire width F, a cross-sectional area of the current controlling element 312 is substantially equal to the cross-sectional area of the memory cell 304. Therefore, even when an effective area of the horizontal cross-section of the nonvolatile memory element 308 is made small, the cross-sectional area of the current controlling element 312 can be increased. This makes it possible to increase an allowable current (value of a current during breakdown of the element) flowing through the current controlling element 312, and suppress breakdown of the element.

The third region 319 is formed in such a manner that after forming the first and second regions 315 and 316 of the resistance variable layer 306, their side surfaces are oxidized to form an insulating region around the side surfaces of (first and second resistance variable layers 315 and 316) of the resistance variable layer 306.

Since the side surface of the resistance variable layer 306 is oxidized to form the third region 319 which is the insulating region around the first and second regions 315 and 316 of the resistance variable layer 306 as described above, the effective area of the horizontal cross-section of the nonvolatile memory element 308 can be made smaller easily. Even if misalignment of the first region 315 and the second region 316 with respect to the plug 103 occurs during formation of the first and second regions 315 and 316, a size of the resistance changing region (first and second regions 315 and 316) can be adjusted by adjusting a degree (size of the third region 319) to which the side surfaces of the first and second regions 315 and 316 are oxidized. Therefore, the nonvolatile memory element 318 can be formed with higher yield and higher accuracy.

(Manufacturing Method of Nonvolatile Memory Device of Embodiment 2)

Next, a manufacturing method of the nonvolatile memory device of Embodiment 2 will be described.

FIGS. 8A to 8C and FIGS. 9A and 9B are cross-sectional views schematically showing manufacturing process steps of the nonvolatile memory device shown in FIG. 6.

Figure 8A:
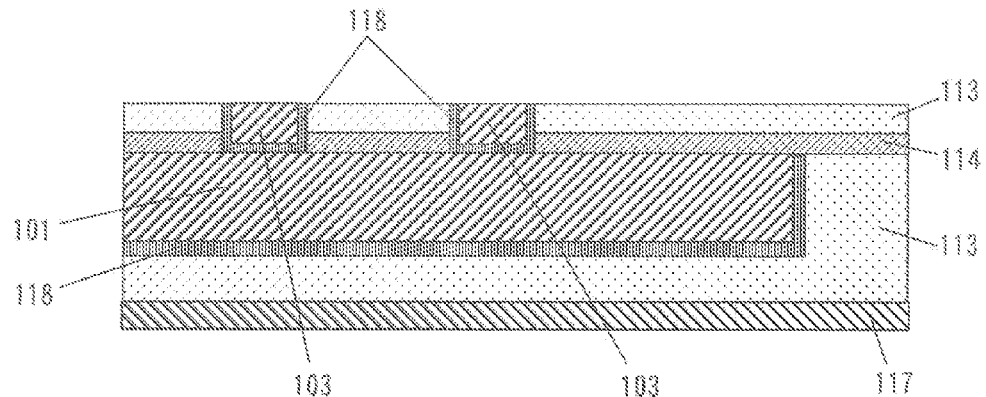
FIG. 8A is a cross-sectional view schematically showing a manufacturing process step of the nonvolatile memory device of FIG. 6.

Initially, in the step of FIG. 8A, the first wire 101 is formed on the semiconductor substrate 117 (step A), and the plug 103 is formed on the first wire 101 such that its upper surface area is a predetermined first area. To be specific, the interlayer insulating layer 113 comprising silicon oxide (e.g., plasma TEOS) is deposited over the semiconductor substrate 117 by plasma CVD, etc. Then, a wire trench into which the first wire 101 is filled is formed in the interlayer insulating layer 113 by photolithography and dry etching. A barrier layer 118 comprising tantalum nitride (5 to 40 nm) and tantalum (5 to 40 nm), and wire material copper (50 to 300 nm) are deposited into this wire trench, by sputtering, or the like. Then, by electroplating or the like, copper is further deposited on a copper seed layer so that the wire trench is fully filled with the wire material copper. Then, extra copper on the upper surface of the deposited copper and a portion of the barrier layer 118 are removed by CMP to planarize the upper surface of the interlayer insulating layer 113 and the upper surface of the first wire 101, thereby forming the first wire 101. Then, an SiN layer is deposited with a thickness of about 30 to 200 nm by plasma CVD or the like, thereby forming the liner layer 114 such that the liner layer 114 covers the first wire 101. Then, the interlayer insulating layer 113 is further deposited over the liner layer 114. If necessary, the upper surface is planarized by CMP to lessen a level difference. Then, by photolithography and dry etching, a hole into which the plug 103 is filled is formed on a predetermined location on the first wire 101 such that the upper surface area is the predetermined first area (circle with a diameter of about 200 nm). Then, the barrier layer 118 comprising tantalum nitride (5 to 40 nm) and tantalum (5 to 40 nm), and the wire material copper (50 to 300 nm) are deposited into the hole, by sputtering or the like. Then, by electroplating or the like, copper is further deposited on a copper seed layer so that the hole is fully filled with the barrier layer 118 and copper, thereby forming the plug 103. Then, extra copper on the upper surface of the deposited copper and a portion of the barrier layer 118 are removed by CMP to planarize the upper surface of the interlayer insulating layer 113 and the upper surface of the plug 103.

Figure 8B:
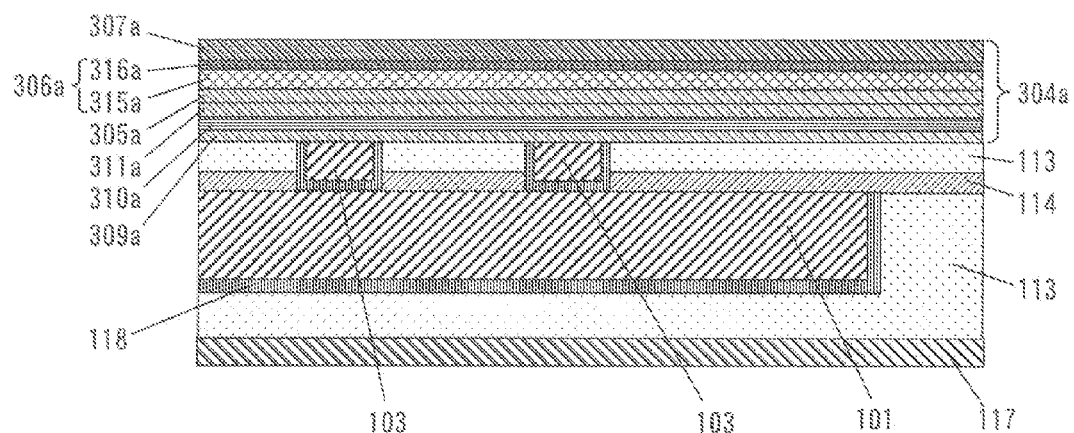
FIG. 8B is a cross-sectional view schematically showing a manufacturing process step of the nonvolatile memory device of FIG. 6.
Figure 8C:
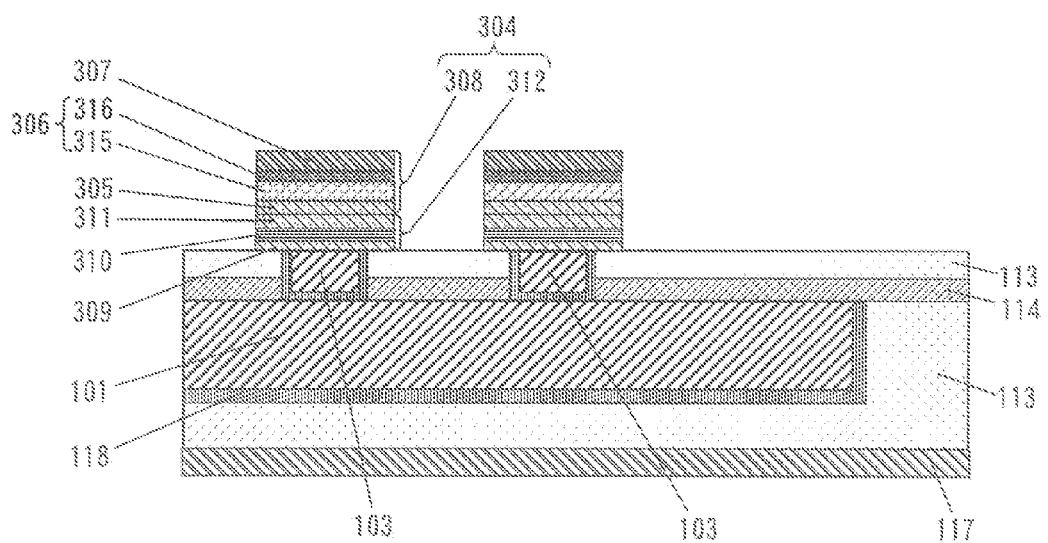
FIG. 8C is a cross-sectional view schematically showing a manufacturing process step of the nonvolatile memory device of FIG. 6.
Figure 9A:
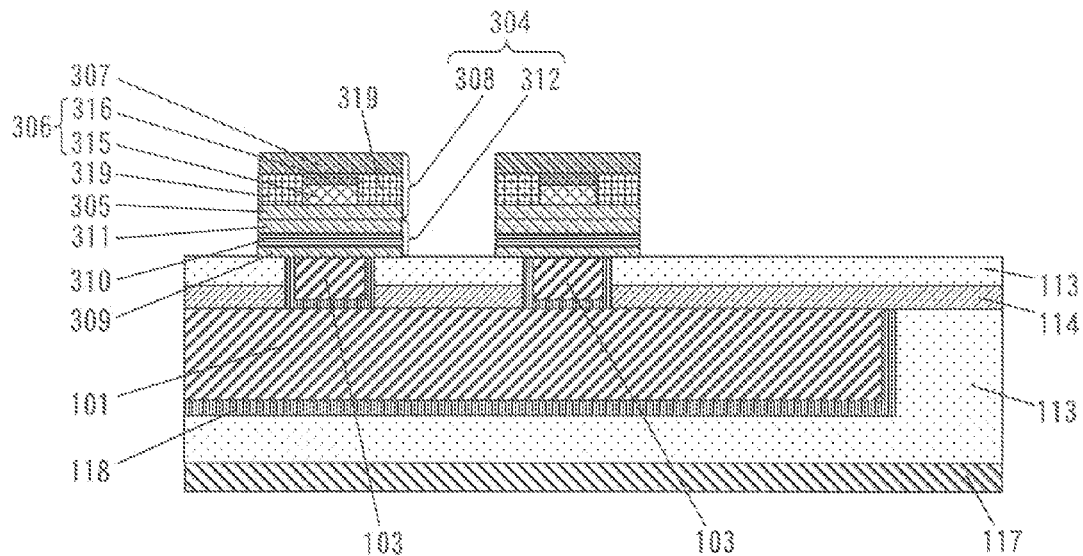
FIG. 9A is a cross-sectional view schematically showing a manufacturing process step of the nonvolatile memory device of FIG. 6.

Then, in the step of FIGS. 8B, 8C, and FIG. 9A, the memory cell 304 having the stacked-layer structure including the current controlling element 312 and the nonvolatile memory element 308 is formed on the upper surface of the plug 103. Firstly, in the step of FIG. 8B, deposited over the entire surface including the plug 103 and the interlayer insulating layer 113, are, a third electrode layer 309a (10 to 100 nm in thickness, for example, 30 nm) comprising tantalum, tantalum nitride, titanium, or titanium nitride (e.g., tantalum nitride), a nitrogen-deficient silicon nitride layer 310a (10 to 30 nm in thickness, for example, 20 nm) having a lower nitrogen concentration than a stoichiometric composition, a fourth electrode layer 311a and a first electrode layer 305a which are similar to the third electrode layer 309a, a conductive transition metal oxide layer 306a (10 to 100 nm in thickness, for example, 50 nm, 0.5 to 20 mΩ·cm in resistivity, e.g., 2 mΩ·cm) comprising tantalum, titanium, nickel, or the like (e.g., oxygen-deficient tantalum oxide), and a second electrode layer 305a (10 to 100 nm in thickness, for example, 50 nm) comprising precious metal such as platinum, iridium, palladium, ruthenium, or the like (e.g., iridium). These layers are horizontally stacked sequentially, thereby forming the stacked-layer constituent 304a. At this time, alternatively, tantalum nitride, titanium nitride, or titanium aluminum nitride (e.g., tantalum nitride) which is a conductive layer (not shown), may be further stacked horizontally on the second electrode comprising precious metal, as a hard mask used in dry etching, thereby forming the stacked-layer constituent 304a.

The first to fourth electrode layers 305a, 307a, 309a, and 311a and the conductive hard mask (not shown) may be deposited by sputtering or the like. The silicon nitride layer 110a is deposited by reactive sputtering in which sputtering is performed in argon and nitrogen atmosphere using a silicon target. The transition metal oxide layer 306a is deposited by reactive sputtering in which sputtering is performed in argon and oxygen atmosphere using a tantalum target. The resistivity of the transition metal oxide layer 306a can be adjusted to be 0.5 to 20 mΩ·cm by adjusting a flow rate of oxygen so that the oxygen concentration of the layer is controlled at 45 to 65 atm %. (For example, by setting the oxygen concentration to 60 atm %, the transition metal oxide layer 306a having a resistivity of about 2 mΩ·cm can be deposited). Further, the transition metal oxide layer 306a may be oxidized to form a $Ta_2O_5$ layer with a thickness of 2 to 12 nm on an uppermost layer of the oxygen-deficient transition metal oxide layer 306a (first region 315a), as the second region 316a having a higher oxygen content.

Then, in the step of FIG. 8C, the stacked-layer constituent 304a stacked horizontally is processed by photolithography and dry etching, to form the memory cell 304 (current controlling element 312 and nonvolatile memory element 308) having the stacked-layer structure which is independent of another memory cell 304 and has an island shape (square shape in horizontal cross-section in which one side is 100 to 400 nm, for example, one side is 250 nm) such that the memory cell 304 is connected to the plug 103 (step B).

Then, in the step of FIG. 9A, the side surface of the formed memory cell 304 having the stacked-layer structure is oxidized by RTA or plasma oxidization to oxidize the side surface of the transition metal oxide layer 306a, thereby forming the third region 319 which is an insulator and is sandwiched between the first electrode 305 and the second electrode 307. As a result, a region of the transition metal oxide layer 306a which has not been oxidized becomes the resistance variable layer 306 which is the electrically-conductive region. By setting an oxygen concentration to 68 to 71 atm % which is closer to that of the stoichiometric composition, the third region 319 comprising $Ta_2O_5$ which is highly insulative can be formed.

An oxidization amount of the side surface of the memory cell 304 having the stacked-layer structure, i.e., a horizontal thickness of the third region 319 is controlled so that the area of the horizontal cross-section of the resistance variable layer 306 (first region 315 and second region 316) which is the electrically-conductive region is smaller than the area (first area) of the end surface of the plug 103 which contacts the memory cell 304 having the stacked-layer structure. In the present embodiment, the area of the horizontal cross-section of the resistance variable layer 306 is smaller than the area of the main surface of the first electrode 305 and of a main surface of the second electrode 307. For example, when the diameter of the plug 103 is 200 nm and the size of the overall stacked-layer structure 304 is 250 nm, it is preferable that the horizontal thickness of the third region 319 is equal to or greater than 25 nm at one side (equal to or greater than 50 nm, in total). Further, in view of non-uniformity attributed to process steps, the horizontal thickness of the third region 319 may be set to about 30 nm at one side (60 nm in total). Since the area of the horizontal cross-section of the resistance variable layer 306 is smaller than the first area, it is possible to surely reduce an effective area of a portion of the element through which a current flows during initial breakdown. As a result, the density of the current flowing through the element becomes high, and an initial breakdown voltage can be reduced.

Figure 9B:
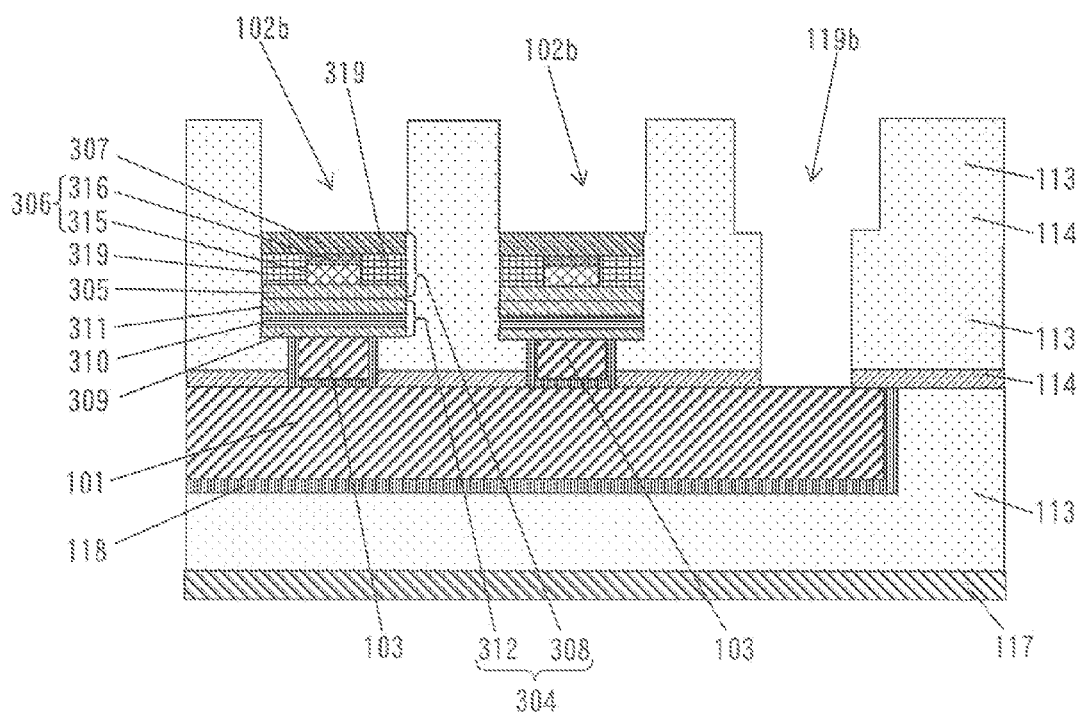
FIG. 9B is a cross-sectional view schematically showing a manufacturing process step of the nonvolatile memory device of FIG. 6.

Then, in the step of FIG. 9B and FIG. 7, the plurality of second wires 102 are formed on the memory cells 304 having the stacked-layer structures, such that the plurality of second wires 102 are arranged in parallel within a plane parallel to the main surface of the semiconductor substrate 117 and three-dimensionally cross the plurality of first wires 101, respectively (step C). Firstly, in the step of FIG. 9B, the interlayer insulating layer 113 is further deposited over the entire surface including the memory cell 304 having the stacked-layer structure, and the interlayer insulating layer 113. Then, by photolithography and dry etching, the wire trench 102b into which the second wire 102 three-dimensionally crossing the first wire 101 is filled is formed on the stacked-layer structure 304, and the hole 119b into which the wire connection plug 119 is filled is formed, on a predetermined region of the first wire 101, where the memory cell 304 having the stacked-layer structure is not formed. Typically, the hole for the plug 119 is formed by photolithography and dry etching in a first order, and then the wire trench for the second wire 102 is formed by photolithography and dry etching in a second order. However, the wire trench may be formed in a first order. In the present embodiment, after the hole into which the plug 119 is filled is formed, etching is performed to expose the upper surface of the memory cell 304 having the stacked-layer structure, to be precise, the second electrode 307, thereby forming the wire trench into which the second wire 102 is filled. When the electrically-conductive hard mask (not shown) is formed, etching is performed to expose the hard mask, thereby forming the wire trench. The hard mask may be etched away completely. The hard mask had better be etched away completely, because a parasitic resistance of the wire can be made low and non-uniformity in contact resistances can be lessened, as compared to a case where the hard mask is left. Then, using conditions similar to those used when the first wire 101 is filled, the barrier layer 118 comprising tantalum nitride (5 to 40 nm) and tantalum (5 to 40 nm), and the wire material copper (50 to 300 nm) are deposited into the wire trench and the hole, by sputtering or the like. Then, by electroplating or the like, copper is further deposited on a copper seed layer so that the wire trench is fully filled with the wire material copper. Then, extra copper on the upper surface of the deposited copper and a portion of the barrier layer 118 are removed by CMP to planarize the upper surface of the interlayer insulating layer 113 and the upper surface of the second wire 102, thereby forming the second wire 102. Then, as shown in FIG. 7, a silicon nitride layer is deposited with a thickness of about 30 to 200 nm, for example, 50 nm, by plasma CVD or the like, thereby forming the liner layer 114 such that the liner layer 114 covers the second wire 102.

In the nonvolatile memory device of the present embodiment, after the stacked-layer structure 304a including the transition metal oxide layer 306a is dry-etched, the side surface of the transition metal oxide layer 306a is oxidized, and the transition metal oxide layer 306a is entirely covered with the metal oxide (third region 319) as the insulator. Therefore, when the memory cell 304 having the stacked-layer structure is dry-etched, it is not necessary to process the memory cell so that its size is smaller than the size of the plug 103. Because of this, the effective area of the horizontal cross-section of the nonvolatile memory element 308 can be reduced easily. In addition, even if misalignment with the plug occurs when the stacked-layer structure 304a is dry-etched to form the memory cell 304 having the stacked-layer structure, a size of a resistance changing region can be adjusted by adjusting a degree (size of the third region 319) to which the side surface of the transition metal oxide layer 306a is oxidized. Therefore, the nonvolatile memory element can be formed with higher yield and higher accuracy.

Although the configuration of the present embodiment has been described regarding the memory cell 304 having the stacked-layer structure of the current controlling element 312 and the nonvolatile memory element 308, and the plug 103, the present invention is not limited to this, but other configuration may be used, so long as at least the nonvolatile memory element 308 and the plug 103 are provided. In that case, one end of the plug 103 is connected to one end of the nonvolatile memory element 108. The other end of the plug 103 or the other end of the nonvolatile memory element 308 may be connected to a source or drain of an access transistor provided separately.

Modified Example of Embodiment 2

Figure 10:
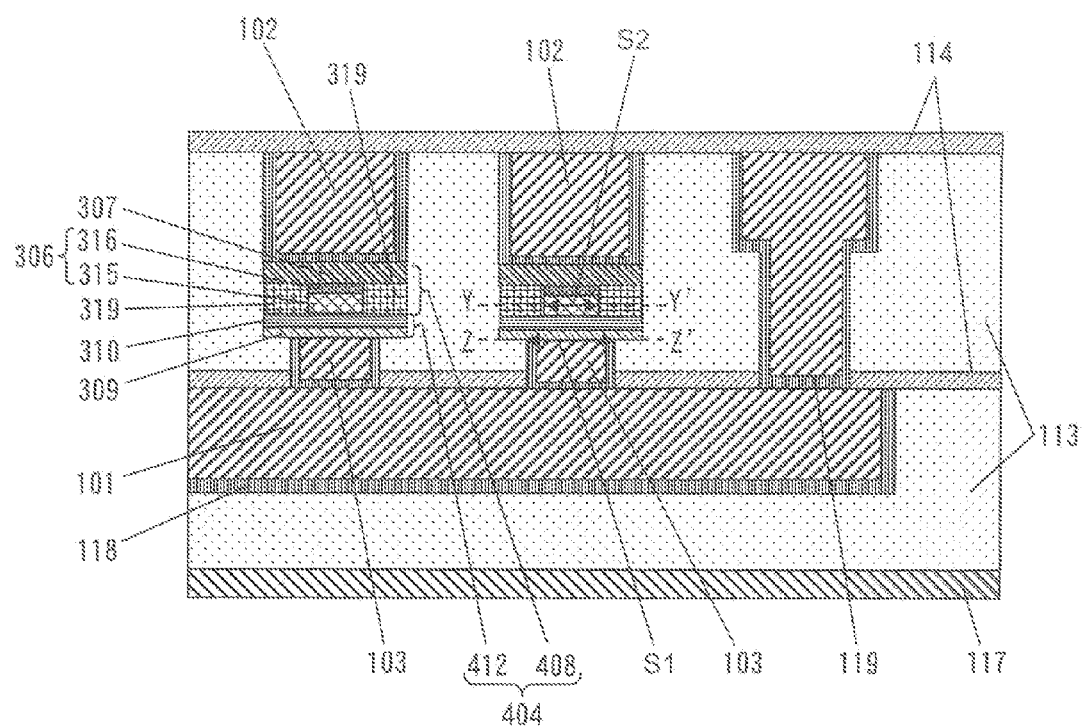
FIG. 10 is a cross-sectional view showing a configuration of a modified example of the nonvolatile memory device according to Embodiment 2 of the present invention.

Hereinafter, a modified example of Embodiment 2 will be described. FIG. 10 is a cross-sectional view showing a configuration of a modified example of the nonvolatile memory device according to Embodiment 2 of the present invention. FIG. 10 shows a cross-section similar to the cross-section taken along line VII-VII' in FIG. 6. In FIG. 10, the same constituents as those of FIG. 7 are identified by the same reference symbols and will not be described in repetition.

The present modified example is different from the example of FIGS. 6 and 7 in that an intermediate electrode is omitted from a memory cell 404 having a stacked-layer structure. In other words, a nonvolatile memory element 408 of the modified example does not include the first electrode 305 in the example of FIG. 5, and a current controlling element 412 of the modified example does not include the fourth electrode 311 in the example of FIG. 7. Therefore, the resistance variable layer 306 (first region 315 of the resistance variable layer 306) of the nonvolatile memory element 408 is formed on a semiconductor layer 310 of the current controlling element 412. The other layers of the memory cell 404 having the stacked-layer structure are similar to those of the example of FIG. 5.

As a result, the memory cell 404 having the stacked-layer structure is simpler and thinner than the example of FIG. 7. This makes it possible to lessen an influence of a parasitic resistance and control a current density easily. In addition, this makes it possible to improve processing accuracy and lessen non-uniformity in dimensions. Since non-uniformity in the densities of the currents flowing through the nonvolatile memory element 408 can be lessened, electric failure can be lessened, reduction of yield can be prevented, and reliability can be improved.

Thus far, the embodiments of the present invention have been described. The present invention is not limited to the above described embodiments, but may be improved, changed or modified in various ways without departing from the spirit of the present invention. For example, the constituents of the plurality of embodiments may be combined as desired. Although in the present embodiment, the configuration in which the plug is provided only below the stacked-layer structure has been described, the present invention is applicable to a configuration in which the plug is provided only above the stacked-layer structure or a configuration in which the plugs are provided below and above the stacked-layer structure (configuration in which the stacked-layer structure is provided between the upper and lower plugs). In those cases, advantages similar to those of the present embodiment are achieved.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

The present invention is useful, because the present invention can suppresses non-uniformity in initial breakdown voltages among nonvolatile memory elements and prevent reduction of yield, in a large-capacity nonvolatile memory device for use as a storage or a memory incorporated into various digital devices including a cellular phone.

REFERENCE SIGNS LISTS

101 first wire
102 second wire
103 plug
104, 204, 304, 404 memory cell having a stacked-layer structure
105, 305 first electrode
106, 306 resistance variable layer
107, 307 second electrode
108, 208, 308, 408 nonvolatile memory element
109, 309 third electrode
110, 310 semiconductor layer
111, 311 fourth electrode
112, 212, 312, 412 current controlling element
113 interlayer insulating layer
114 liner layer
115, 315 first region
116, 316 second region
117 semiconductor substrate
118 barrier layer
119 plug
319 third region

The invention claimed is:

1. A nonvolatile memory device comprising:
a nonvolatile memory element provided on a substrate, and including a first electrode, a second electrode, and a resistance variable layer provided between the first electrode and the second electrode, resistance values of the resistance variable layer changing reversibly in response to electric signals applied between the first electrode and the second electrode, the nonvolatile memory element having a stacked-layer structure in which the first electrode, the second electrode and the resistance variable layer are stacked together such that the first electrode, the second electrode and the resistance variable layer are parallel to a main surface of the substrate and are planarized; and
a plug electrically connected to either the first electrode or the second electrode of the nonvolatile memory element;
wherein the resistance variable layer includes an oxygen-deficient first transition metal oxide layer and a second transition metal oxide layer having a higher oxygen content than the first transition metal oxide layer;
the first transition metal oxide layer is connected to one of the first electrode and the second electrode, and the second transition metal oxide layer is connected to the other of the first electrode and the second electrode; and
an area of an end surface of the plug at which the plug and the nonvolatile memory element are connected together, the end surface being parallel to the main surface of the substrate, is greater than a cross-sectional area of a cross-section of the first transition metal oxide layer which is an electrically-conductive region, the cross-section being parallel to the main surface of the substrate.

2. The nonvolatile memory device according to claim 1, wherein the second transition metal oxide layer is an insulator.

3. The nonvolatile memory device according to claim 1, comprising:
a plurality of first wires formed on the substrate such that the plurality of first wires are arranged in parallel with each other within a plane parallel to the main surface of the substrate;
a plurality of second wires formed within a plane different from the plane of the plurality of first wires such that the plurality of second wires are arranged in parallel with each other and three-dimensionally cross the plurality of first wires, respectively; and
nonvolatile memory elements provided to correspond to three-dimensional cross-points of the plurality of first wires and the plurality of second wires, respectively;
wherein each of the nonvolatile memory elements is configured such that the first electrode is electrically connected to a corresponding one of the first wires, the second electrode is electrically connected to a corresponding one of the second wires, resistance values of the resistance variable layer changing reversibly in response to electric signals applied between the first electrode and the second electrode, via the corresponding one of the first wires and the corresponding one of the second wires; and one of the first electrode and the second electrode is electrically connected to one of the corresponding one of the first wires and the corresponding one of the second wires, via the plug, and the other of the first electrode and the second electrode is directly electrically connected to the other of the corresponding one of the first wires and the corresponding one of the second wires.

4. The nonvolatile memory device according to claim 1, wherein the first electrode or the second electrode connected with the second transition metal oxide layer of the resistance variable layer comprises iridium or alloy of iridium and another precious metal.

5. The nonvolatile memory device according to claim 1, wherein the resistance variable layer further includes a third transition metal oxide layer provided to cover a side surface of the first transition metal oxide layer and a side surface of the second transition metal oxide layer, the third transition metal oxide layer having a higher oxygen content than the first transition metal oxide layer;

the third transition metal oxide layer is sandwiched between the first electrode and the second electrode; and the area of the end surface of the plug at which the plug and the nonvolatile memory element are connected together, the end surface being parallel to the main surface of the substrate, is greater than a cross-sectional area of a cross-section of the first transition metal oxide layer which is an electrically-conductive region, the cross-section being parallel to the main surface of the substrate, and is smaller than an area of a surface of the first electrode and an area of a surface of the second electrode, the surface of the first electrode and the surface of the second electrode being parallel to the main surface of the substrate.

6. The nonvolatile memory device according to claim 1, wherein the area of the end surface of the plug at which the plug and the nonvolatile memory element are connected together, is greater than a cross-sectional area of a cross-section of the nonvolatile memory element, the cross-section being parallel to the main surface of the substrate.

7. A nonvolatile memory device comprising:

a nonvolatile memory element provided on a substrate, and including a first electrode, a second electrode, and a resistance variable layer provided between the first electrode and the second electrode, resistance values of the resistance variable layer changing reversibly in response to electric signals applied between the first electrode and the second electrode, the nonvolatile memory element having a stacked-layer structure in which the first electrode, the second electrode and the resistance variable layer are stacked together such that the first electrode, the second electrode and the resistance variable layer are parallel to a main surface of the substrate and are planarized;

a plug electrically connected to either the first electrode or the second electrode of the nonvolatile memory element;

a first wire formed within a plane parallel to the main surface of the substrate; and a second wire formed within a plane different from the plane of the first wire;

one of the first wire and the second wire is electrically connected to one of the first electrode and the second electrode of the nonvolatile memory element via the plug, and the other of the first wire and the second wire is directly electrically connected to the other of the first electrode and the second electrode of the nonvolatile memory element;

wherein the resistance variable layer includes an oxygen-deficient first transition metal oxide layer and a second transition metal oxide layer having a higher oxygen content than the first transition metal oxide layer;

the first transition metal oxide layer is connected to one of the first electrode and the second electrode, and the second transition metal oxide layer is connected to the other of the first electrode and the second electrode; and an area of an end surface of the plug at which the plug and the nonvolatile memory element are connected together, the end surface being parallel to the main surface of the substrate, is greater than a cross-sectional area of a cross-section of the first transition metal oxide layer which is an electrically-conductive region, the cross-section being parallel to the main surface of the substrate.

8. The nonvolatile memory device according to claim 7, wherein each of the first wire and the second wire comprises copper as a major component.

9. A method of manufacturing a nonvolatile memory device, comprising:

a step A of forming at least a wire and a plug connected to the wire, on a substrate; and a step B of forming above the plug, a stacked-layer structure including a first electrode, a second electrode located above the first electrode, and a resistance variable layer provided between the first electrode and the second electrode, resistance values of the resistance variable layer changing reversibly in response to electric signals applied between the first electrode and the second electrode, the stacked-layer structure having a stacked-layer structure in which the first electrode, the second electrode and the resistance variable layer are stacked together such that the first electrode, the second electrode and the resistance variable layer are parallel to a main surface of the substrate and are planarized;

wherein the step B includes, to form the resistance variable layer, a step b1 of forming an oxygen-deficient first transition metal oxide layer connected to one of the first electrode and the second electrode; a step b2 of forming a second transition metal oxide layer connected to the other of the first electrode and the second electrode and having a higher oxygen content than the first transition metal oxide layer; and a step b3 of forming the plug and/or the stacked-layer structure such that an area of an end surface of the plug at which the plug and the stacked-layer structure are connected together, is greater than a cross-sectional area of a cross-section of the first transition metal oxide layer which is an electrically-conductive region, the cross-section being parallel to the main surface of the substrate.

10. The method of manufacturing the nonvolatile memory device, according to claim 9, wherein the step A includes a step a1 of forming a plurality of first wires in parallel with each other, on the substrate, and a step a2 of forming a plurality of plugs on the plurality of first wires, respectively; the method further comprising:

a step C of forming a plurality of second wires within a plane parallel to the main surface of the substrate above the stacked-layer structures and the plugs such that the plurality of second wires are arranged in parallel with each other and three-dimensionally cross the plurality of first wires, respectively;

wherein one of the first electrode and the second electrode is electrically connected to corresponding one of the first wires via the plug, and the other of the first electrode and the second electrode is directly electrically connected to corresponding one of the second wires.

11. The method of manufacturing the nonvolatile memory device, according to claim 9, wherein the step B includes stacking a first electrode layer, above the plug; stacking a transition metal oxide layer including the first transition metal oxide layer and the second transition metal oxide layer, on the first electrode layer; stacking a second electrode layer on the transition metal oxide layer to form a stacked-layer constituent; and removing a portion of the stacked-layer constituent to form the stacked-layer structure on the plug.

12. The method of manufacturing the nonvolatile memory device, according to claim 9, wherein the step B further includes oxidizing a side surface of the resistance variable layer to form a third transition metal oxide layer such that the third transition metal oxide layer covers a side surface of the first transition metal oxide layer and has a higher oxygen content than the first transition metal oxide layer, to reduce an area of the first transition metal oxide layer which is parallel to the main surface of the substrate so that a cross-sectional area of a cross-section of the first transition metal oxide layer which is an electrically-conductive region, the cross-section being parallel to the main surface of the substrate, is smaller than an area of an end surface of the plug at which the plug and the stacked-layer structure are connected together.

13. A method of manufacturing a nonvolatile memory device, comprising:

a step A of forming at least a first wire and a plug connected to the first wire, on a substrate;

a step B of forming above the plug, a stacked-layer structure including a first electrode, a second electrode located above the first electrode, and a resistance variable layer provided between the first electrode and the second electrode, resistance values of the resistance variable layer changing reversibly in response to electric signals applied between the first electrode and the second electrode, the stacked-layer structure having a stacked-layer structure in which the first electrode, the second electrode and the resistance variable layer are stacked together such that the first electrode, the second electrode and the resistance variable layer are parallel to a main surface of the substrate and are planarized; and a step C of forming a second wire within a plane parallel to the main surface of the substrate above the stacked-layer structure and the plug;

wherein the step B includes, to form the resistance variable layer, a step b1 of forming an oxygen-deficient first transition metal oxide layer connected to one of the first electrode and the second electrode; a step b2 of forming a second transition metal oxide layer connected to the other of the first electrode and the second electrode and having a higher oxygen content than the first transition metal oxide layer; and a step b3 of forming the plug and/or the stacked-layer structure such that an area of an end surface of the plug at which the plug and the stacked-layer structure are connected together, is greater than a cross-sectional area of a cross-section of the first transition metal oxide layer which is an electrically-conductive region, the cross-section being parallel to the main surface of the substrate; and the step C includes, to form the second wire, a step c1 of forming an insulating layer such that the insulating layer covers the stacked-layer structure; a step c2 of removing a portion of the insulating layer such that the stacked-layer structure is exposed, to form a wire trench on the stacked-layer structure; and a step c3 of forming the second wire into the wire trench.

* * * * *